United States Patent
Lee et al.

(10) Patent No.: US 12,437,686 B2
(45) Date of Patent: Oct. 7, 2025

(54) ELECTRONIC DEVICE INCLUDING CRACK DETECTION WIRING

(71) Applicant: Samsung Display Co., Ltd., Yongin-Si (KR)

(72) Inventors: Kyungsu Lee, Suwon-si (KR); Jong-Hwa Kim, Yongin-si (KR); Jeongyun Han, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 18/925,018

(22) Filed: Oct. 24, 2024

(65) Prior Publication Data

US 2025/0054426 A1 Feb. 13, 2025

Related U.S. Application Data

(63) Continuation of application No. 18/205,597, filed on Jun. 5, 2023, now Pat. No. 12,131,674, which is a
(Continued)

(30) Foreign Application Priority Data

Nov. 30, 2018 (KR) ........................ 10-2018-0151886

(51) Int. Cl.
*G09G 3/00* (2006.01)
*H05K 3/42* (2006.01)
(Continued)

(52) U.S. Cl.
CPC ............... *G09G 3/006* (2013.01); *H05K 3/42* (2013.01); *H10K 59/131* (2023.02); *G02F 1/133305* (2013.01)

(58) Field of Classification Search
CPC .......... G09G 3/006; H05K 3/42; H10K 59/131
See application file for complete search history.

(56) References Cited

U.S. PATENT DOCUMENTS 8,704,762 B2 4/2014 Anno et al.
9,653,368 B2 5/2017 Kwak et al.
(Continued)

FOREIGN PATENT DOCUMENTS

CN 102269886 A 12/2011
CN 106201046 A 12/2016
(Continued)

OTHER PUBLICATIONS

Chinese Office Action corresponding to Application No. 201911188724.2 and issued on Oct. 26, 2022, 6 pages.
(Continued)

*Primary Examiner* — Sardis F Azongha
(74) *Attorney, Agent, or Firm* — Innovation Counsel LLP

(57) ABSTRACT

An electronic device including: a display module including a front surface and a rear surface opposite the front surface and including a module hole that penetrates from the front surface to the rear surface; and an electronic module overlapping the module hole. The display module includes a crack detection wiring including a hole wiring disposed in a hole area, and a first detection wiring and a second detection wiring of the crack detection wiring are connected to the hole wiring and disposed on different layers with a detection insulating layer interposed therebetween.

15 Claims, 13 Drawing Sheets

Related U.S. Application Data continuation of application No. 17/682,900, filed on Feb. 28, 2022, now Pat. No. 11,670,205, which is a continuation of application No. 16/698,947, filed on Nov. 27, 2019, now Pat. No. 11,263,936.

(51) Int. Cl.
*H10K 59/131* (2023.01)
*G02F 1/1333* (2006.01)

(56) References Cited

U.S. PATENT DOCUMENTS

| | | | |
|---|---|---|---|
| 9,875,676 | B2 | 1/2018 | Byun et al. |
| 9,905,629 | B2 | 2/2018 | Kim et al. |
| 10,175,841 | B2 | 1/2019 | Kim et al. |
| 10,522,431 | B2 | 12/2019 | Kim et al. |
| 10,522,608 | B2 | 12/2019 | Park et al. |
| 10,665,620 | B2 | 5/2020 | Park et al. |
| 10,937,843 | B2 * | 3/2021 | Ding .................. H10K 59/40 |
| 2016/0048245 | A1 | 2/2016 | Papakostas |
| 2016/0140896 | A1 | 5/2016 | Kwon et al. |
| 2017/0045915 | A1 | 2/2017 | Pope et al. |
| 2017/0162637 | A1 | 6/2017 | Choi et al. |
| 2017/0270842 | A1 | 9/2017 | Nam et al. |
| 2017/0288004 | A1 | 10/2017 | Kim et al. |
| 2018/0011385 | A1 | 1/2018 | Kang et al. |
| 2018/0053792 | A1 | 2/2018 | Shin et al. |
| 2020/0175900 | A1 | 6/2020 | Han et al. |
| 2021/0343748 | A1 | 11/2021 | Liao et al. |

FOREIGN PATENT DOCUMENTS

| | | |
|---|---|---|
| CN | 107450219 A | 12/2017 |
| CN | 107871764 A | 4/2018 |
| CN | 108154800 A | 6/2018 |
| CN | 108649037 A | 10/2018 |
| CN | 111243435 A | 6/2020 |
| JP | 2011123162 A | 6/2011 |
| JP | 2014-139829 A | 7/2014 |
| KR | 10-2016-0148834 A | 12/2016 |
| KR | 10-2017-0066767 A | 6/2017 |
| KR | 10-2017-0115177 A | 10/2017 |
| KR | 10-2018-0005327 A | 1/2018 |
| KR | 10-2018-0065061 A | 6/2018 |

OTHER PUBLICATIONS

Office Action issued in Chinese patent application No. 202310668090.0 dated Jun. 28, 2025, 7 pages.

* cited by examiner

ELECTRONIC DEVICE INCLUDING CRACK DETECTION WIRING

CROSS-REFERENCE TO RELATED APPLICATIONS

This application is a continuation application of U.S. patent application Ser. No. 18/205,597 filed on Jun. 5, 2023, which is a continuation of U.S. patent application Ser. No. 17/682,900 filed on Feb. 28, 2022 (now U.S. Pat. No. 11,670,205), which is a continuation of U.S. patent application Ser. No. 16/698,947, filed on Nov. 27, 2019 (now U.S. Pat. No. 11,263,936), which claims priority to and the benefit Korean Patent Application No. 10-2018-0151886, filed on Nov. 30, 2018, in the Korean Intellectual Property Office (KIPO). All the above patent applications are incorporated herein by reference in their entireties.

BACKGROUND

The present disclosure herein relates to an electronic device, and more particularly, to an electronic device with improved reliability.

An electronic device is activated in response to an electrical signal. The electronic device may include a display module including a display panel that displays an image and/or an input detection member that senses an external input. Among various display panels, an organic light emitting display panel has low power consumption, high luminance, and high response speed.

Some electronic devices may include an electronic module that receives an external signal and/or provides an output signal to an external device. The electronic module may be coupled with a cover case or the like together with the display panel to form an electronic device.

SUMMARY

The present disclosure is to provide an electronic device capable of easily detecting a crack that may occur in layers around a hole area by including a crack detection wiring disposed around the hole area where an electronic module is disposed.

An embodiment of the inventive concept provides an electronic device including: a display module including a front surface and a rear surface opposite the front surface and including a module hole that penetrates from the front surface to the rear surface; and an electronic module overlapping the module hole, wherein the display module includes: a display member including a base substrate that includes a groove at least partially recessed to surround the module hole and a pixel disposed on the and divided into an active area where the pixel is disposed, a peripheral area adjacent to the active area, and a hole area at least partially surrounded by the active area; an input detection member disposed on the display member to detect an external input and including a detection insulating layer, and a first conductive pattern and a second conductive pattern disposed on different layers with the detection insulating layer interposed therebetween; and a crack detection wiring including a hole wiring spaced apart from the first conductive pattern and the second conductive pattern and disposed in the hole area, and a first detection wiring and a second detection wiring that are spaced apart from each other by a separation space on a plane and extend from the hole area to the peripheral area to be connected to the hole wiring, wherein the first detection wiring and the second detection wiring are disposed on different layers with the detection insulating layer interposed therebetween.

In an embodiment, the hole wiring may overlap the groove on the plane.

In an embodiment, the first detection wiring may be disposed on the same layer as the first conductive pattern, and the second detection wiring may be disposed on the same layer as the second conductive pattern.

In an embodiment, the hole wiring may be disposed on the same layer as any one of the first detection wiring and the second detection wiring.

In an embodiment, the display module may further include a dummy pattern disposed in the separation space, and the dummy pattern may be disposed on the same layer as the first detection wiring.

In an embodiment, a plurality of dummy patterns may be arranged spaced apart from each other in a direction from the first detection wiring toward the second detection wiring.

In an embodiment, a first width of at least one of the first detection wiring and the second detection wiring may be greater than a second width of the hole wiring.

In an embodiment, the display module may include a flat part disposed between the display member and the input detection member, wherein the flat part may include a flat organic film overlapping the hole area of the display member and a flat inorganic film covering the flat organic film and overlapping the active area and the hole area, wherein the first conductive pattern may be disposed directly on the flat inorganic film.

In an embodiment, a boundary between the active area and the hole area may have a step, and a portion of each of the first detection wiring and the second detection wiring may overlap the boundary.

In an embodiment, the input detection member may include: a first detection electrode including first detection sensors extending in a first direction and first connection patterns connecting the first detection sensors; a second detection electrode including second detection sensors extending in a second direction intersecting the first direction and second connection patterns connecting the second detection sensors; and detection trace wirings connected to each of the first detection electrode and the second detection electrode and extending to the peripheral area, wherein the first conductive pattern may include the first connection patterns, wherein the second conductive pattern may include the first detection sensors, the second detection sensors, and the second connection patterns.

In an embodiment, the crack detection wiring may include an input trace wiring and an output trace wiring connected to the first detection wiring and the second detection wiring respectively and extending to the peripheral area, wherein the input trace wiring and the output trace wiring may be disposed on the same layer as the second conductive pattern.

In an embodiment, the first detection wiring may be connected to a first end of the hole wiring and to the input trace wiring through at least one contact hole that penetrates through the detection insulating layer, wherein the second detection wiring may be directly connected to a second end of the hole wiring and the output trace wiring.

In an embodiment, the hole wiring may include an open-curve of an integral shape, wherein a first end of the hole wiring may be connected to the first detection wiring, and a second end of the hole wiring may be connected to the second detection wiring.

In an embodiment, the electronic module may include at least one of an audio output module, a light emitting module, a light receiving module, and a camera module.

In an embodiment of the inventive concept, an electronic device includes: a display member including a base substrate, a pixel disposed on the base substrate, and a sealing part covering the pixel and divided into an active area wherein the pixel is disposed, a peripheral area adjacent to the active area, and a hole area at least partially surrounded by the active area; a flat part disposed on the sealing part and including a flat organic film overlapping the hole area and a flat inorganic film covering the flat organic film and overlapping the active area and the hole area; an input detection member disposed in the active area to detect an external input and including a first conductive pattern disposed on the flat inorganic film, a detection insulating layer covering the first conductive pattern, and a second conductive pattern disposed on a different layer from the first conductive pattern with the detection insulating layer interposed therebetween; and a crack detection wiring including a hole wiring spaced apart from the first conductive pattern and the second conductive pattern and disposed in the hole area, and a first detection wiring and a second detection wiring connected to the hole wiring and disposed on different layers with the detection insulating layer interposed therebetween, wherein a boundary between the active area and the hole area has a step, and a portion of each of the first detection wiring and the second detection wiring overlaps the boundary.

In an embodiment, the step may be formed by an end of the flat organic film adjacent to the sealing part.

In an embodiment, the input detection member may further include a dummy pattern disposed on the same layer as the first detection wiring, and the dummy pattern may overlap the boundary.

In an embodiment, the first detection wiring may be disposed on the same layer as the first conductive pattern, and the second detection wiring may be disposed on the same layer as the second conductive pattern.

In an embodiment, the first detection wiring may be connected to a first end of the hole wiring through at least one contact hole defined through the detection insulating layer, wherein the second detection wiring may be directly connected to a second end of the hole wiring.

In an embodiment, the sealing part may include a sealing organic film and sealing inorganic films sealing the sealing organic film, and at least a portion of the flat organic film may overlap the sealing organic film.

In an embodiment, the hole wiring may include an open-curve of an integral shape, wherein a first end of the hole wiring may be connected to the first detection wiring, and a second end of the hole wiring may be connected to the second detection wiring.

In an embodiment, the display module includes a module hole, the base substrate may include a groove surrounding the module hole by recessing at least a portion of the base substrate and covered by the sealing part, and the hole wiring may overlap the groove on a plane.

BRIEF DESCRIPTION OF THE FIGURES

The accompanying drawings are included to provide further understanding of the inventive concept, and are incorporated in and constitute a part of the present disclosure. The drawings illustrate exemplary embodiments of the inventive concept and, together with the detailed description, serve to explain principles of the inventive concept. In the drawings.

DETAILED DESCRIPTION

Figure 1:
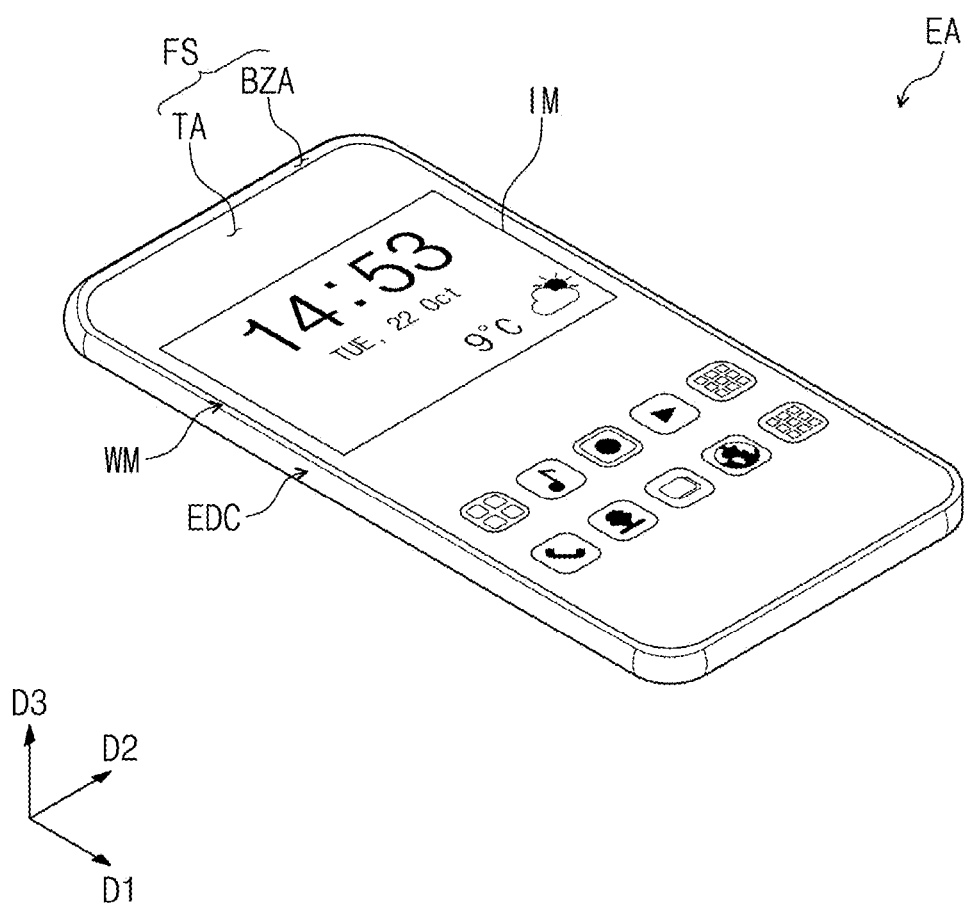
FIG. 1 is an assembled perspective view of an electronic device according to an embodiment of the inventive concept.

In the present disclosure, when it is described that a component (or, an area, a layer, a part, etc.) is referred to as being "on," "connected to," or "combined to" another component, it means that the component may be directly on, connected to, or combined to the other component or a third component therebetween may be present therebetween.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components, but these components should not be limited by these terms. The above terms are used only to distinguish one component from another. For example, a first component may be referred to as a second component or vice versa without departing from the scope of the inventive concept of the present disclosure. A singular expression includes a plural expression unless the context clearly dictates otherwise.

In addition, terms such as "below," "the lower side," "on," and "the upper side" are used to describe a relationship of configurations shown in the drawing. These terms are described as a relative concept based on a direction shown in the drawing, and may be changed depending on the orientation and configuration of the drawing.

Unless otherwise defined, all terms (including technical and scientific terms) used herein have the same meaning as terms commonly understood by those skilled in the art to which the present disclosure belongs. In addition, terms defined in commonly used dictionaries should be interpreted as having a meaning consistent with the meaning in the context of the related art without being interpreted in an ideal or overly formal sense, unless they are explicitly defined herein.

In various embodiments of the inventive concept, the term "include," "comprise," "including," or "comprising," specifies a property, a region, a fixed number, a step, a process, an element, and/or a component but does not exclude other properties, regions, fixed numbers, steps, processes, elements, and/or components. Hereinafter, various exemplary embodiments of the inventive concept will be described with reference to the drawings.

Figure 2A:
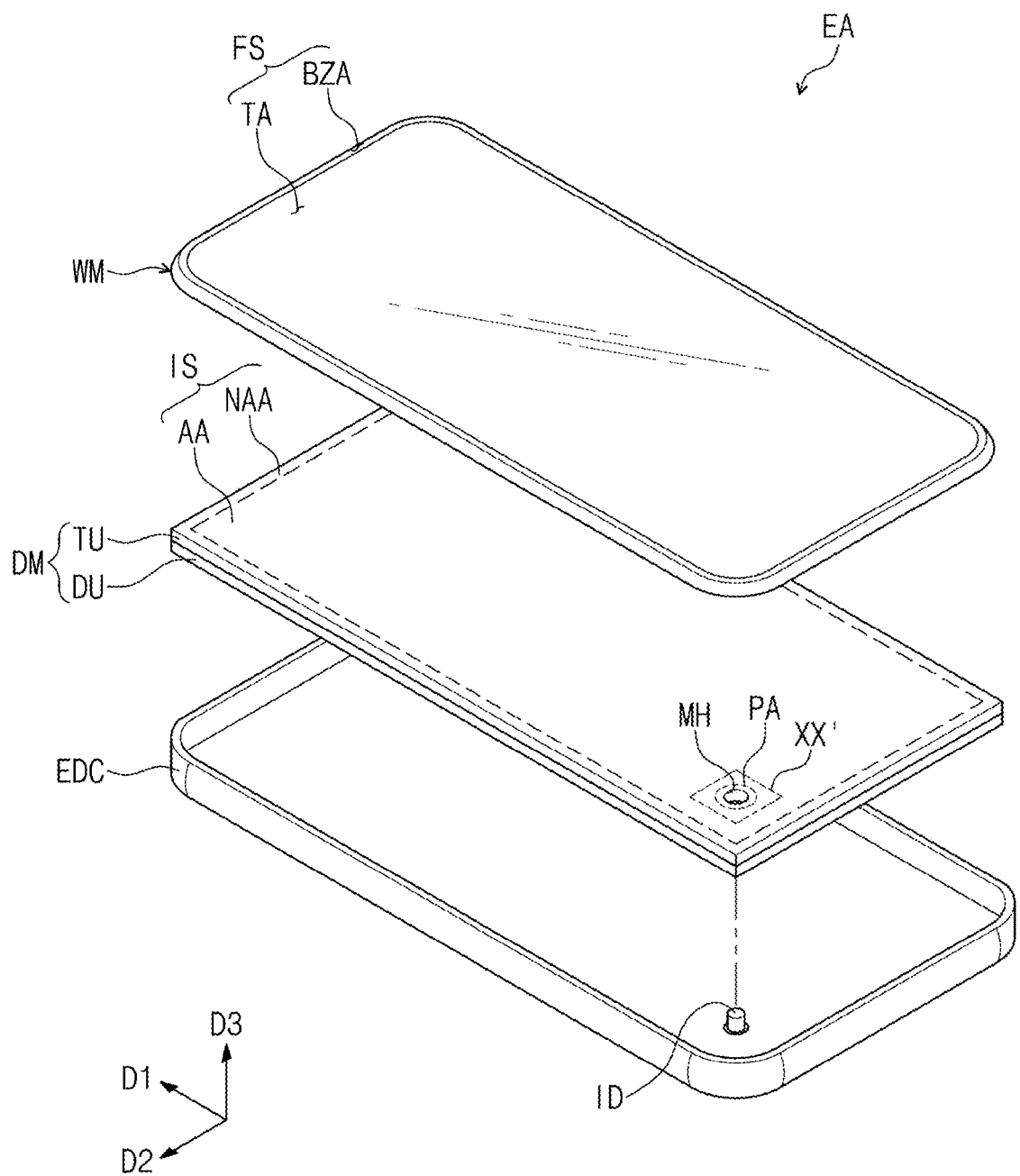
FIG. 2A is an exploded perspective view of an electronic device according to an embodiment of the inventive concept.
Figure 2B:
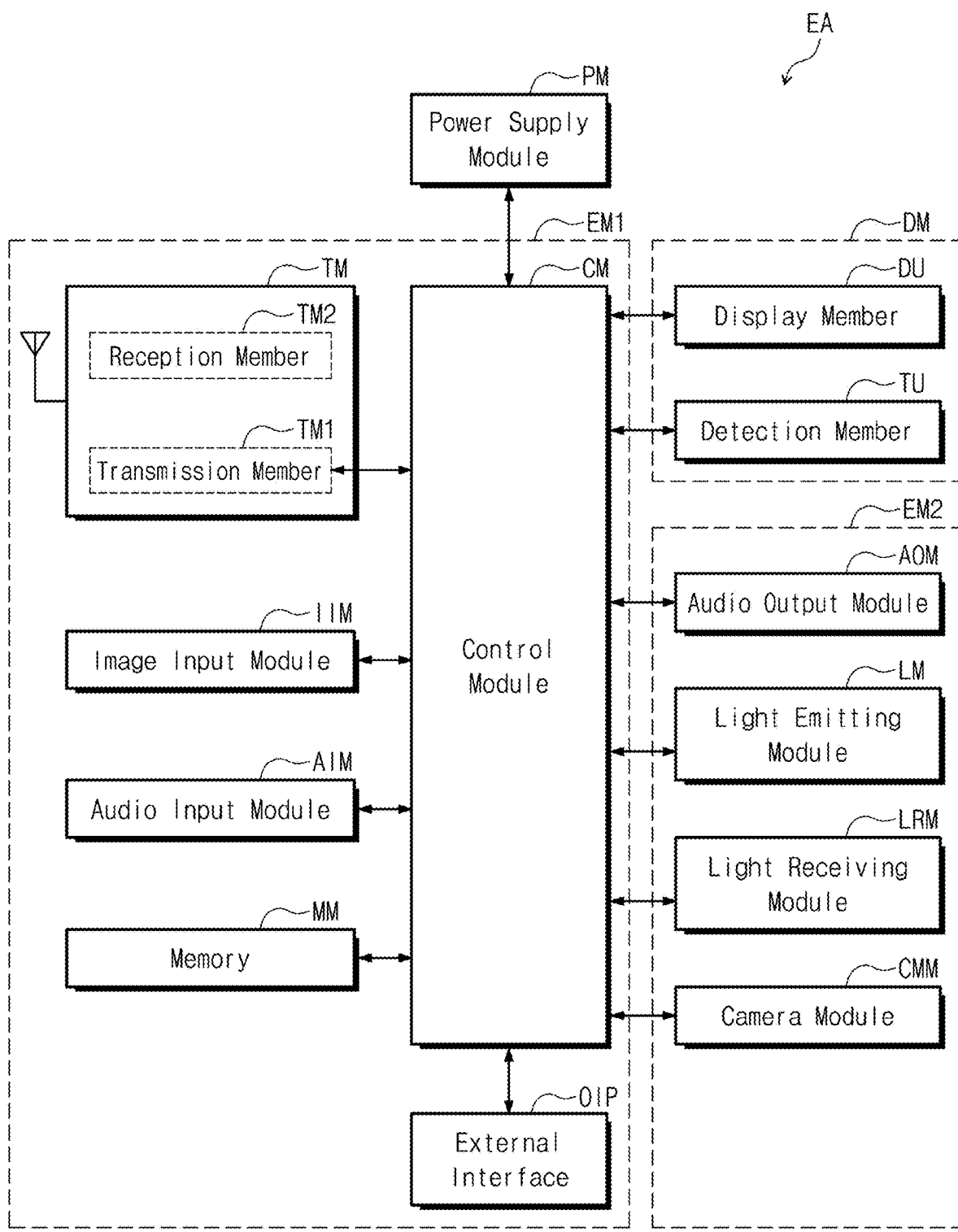
FIG. 2B is a block diagram of the electronic device shown in FIG. 2A.
Figure 3:
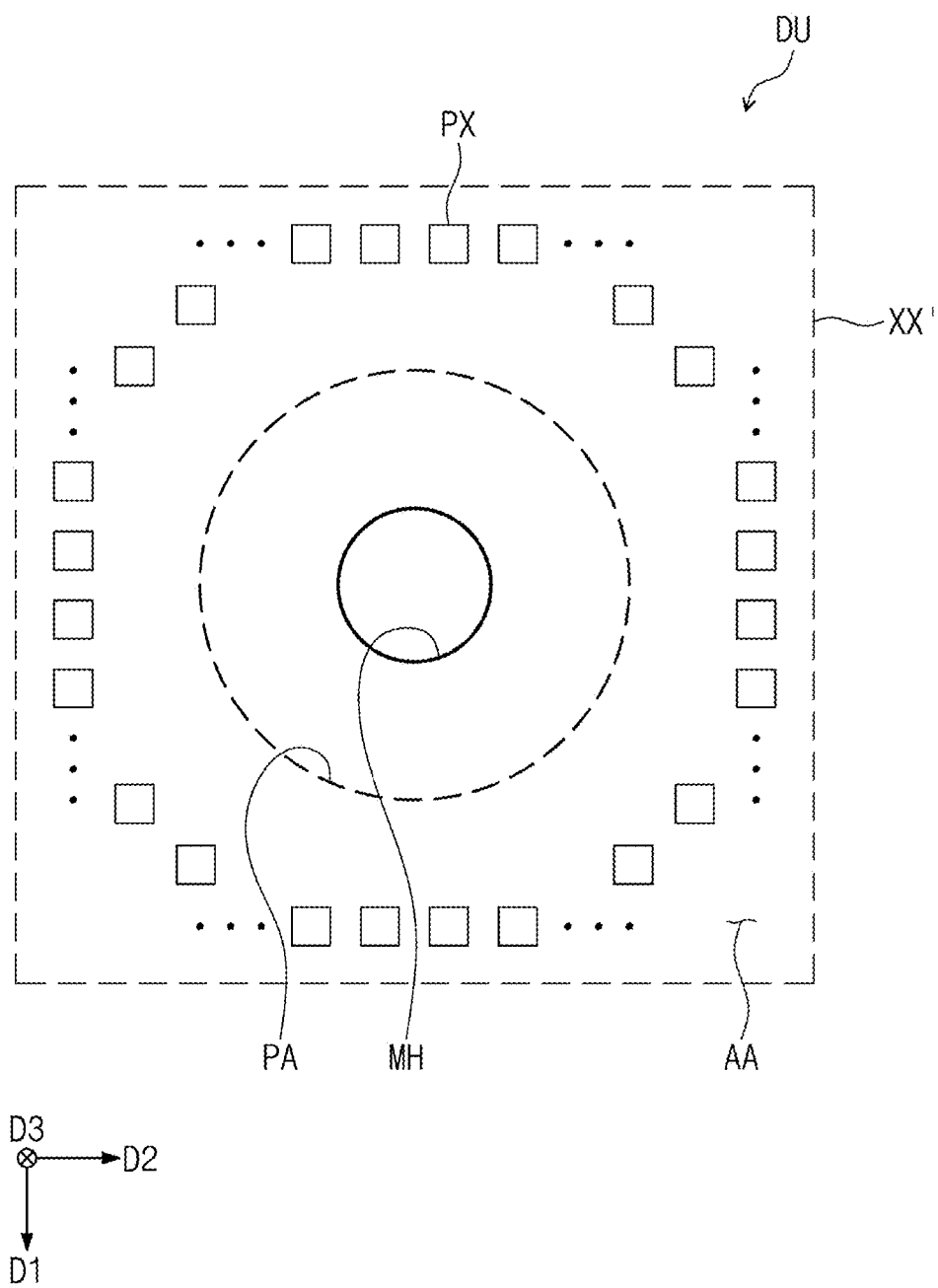
FIG. 3 is a plan view schematically showing an area XX' shown in FIG. 2A.
Figure 4A:
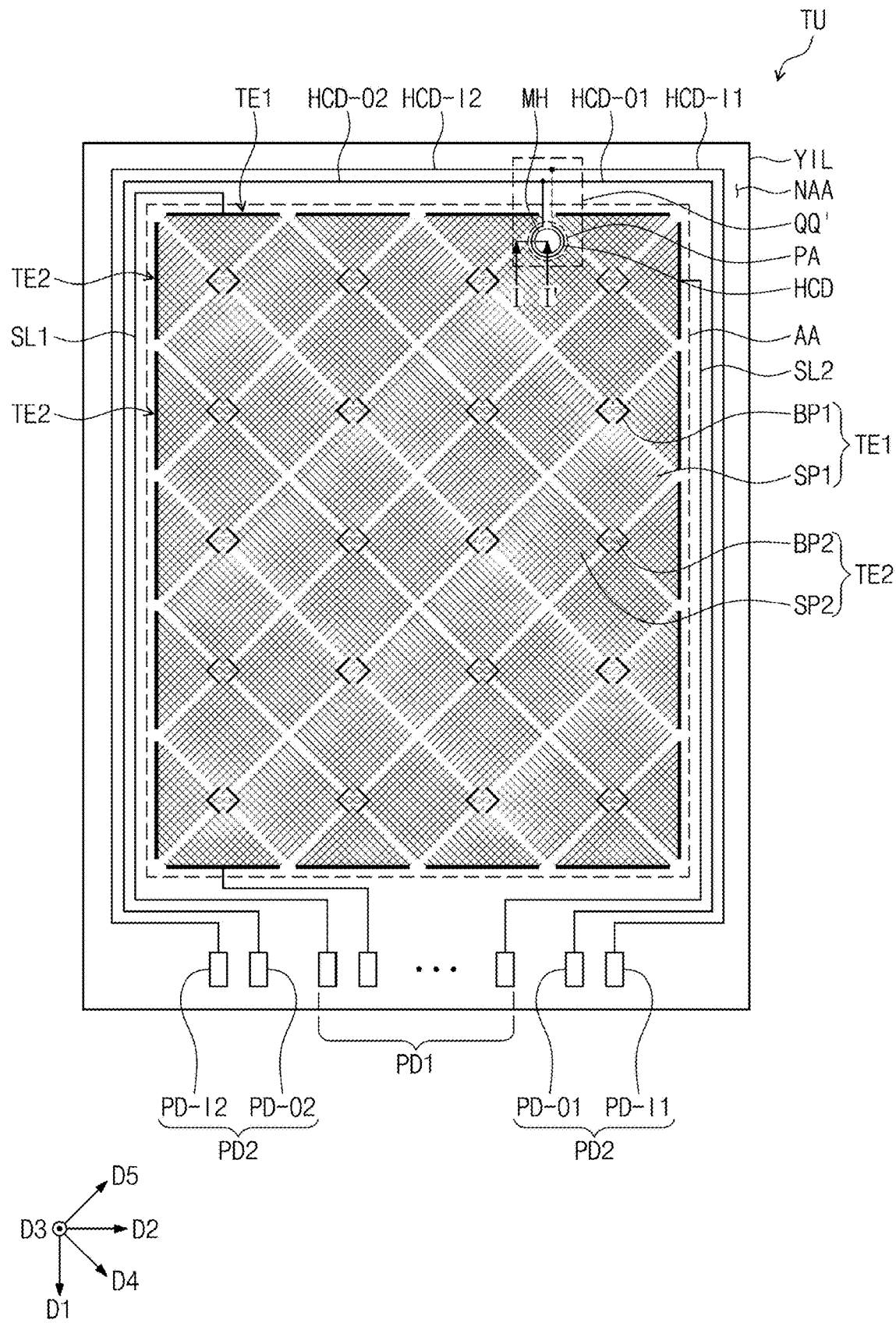
FIG. 4A is a plan view of an input detection member according to an embodiment of the inventive concept.
Figure 4B:
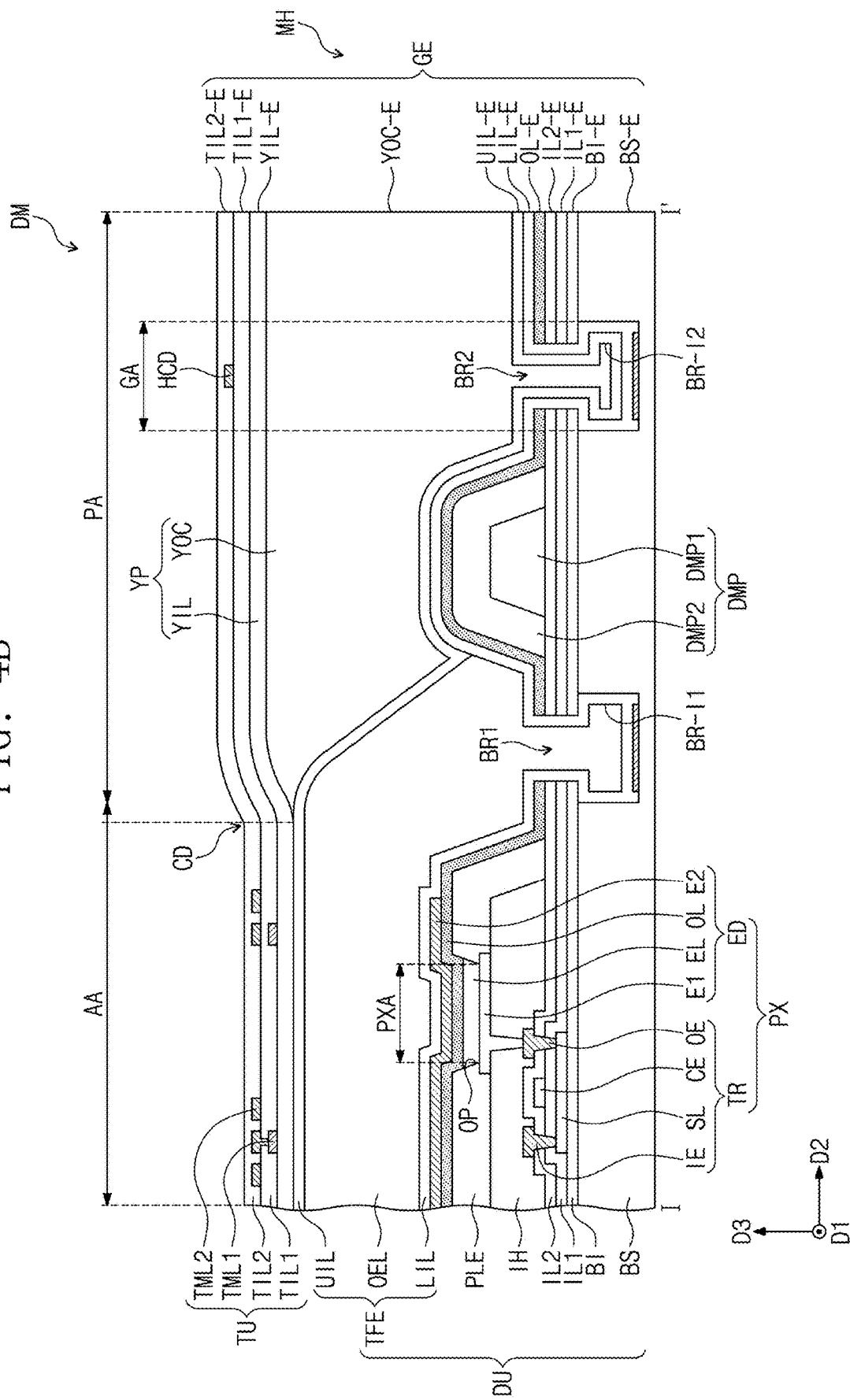
FIG. 4B is a cross-sectional view of an electronic device taken along line I-I' of FIG. 4A.
Figure 5A:
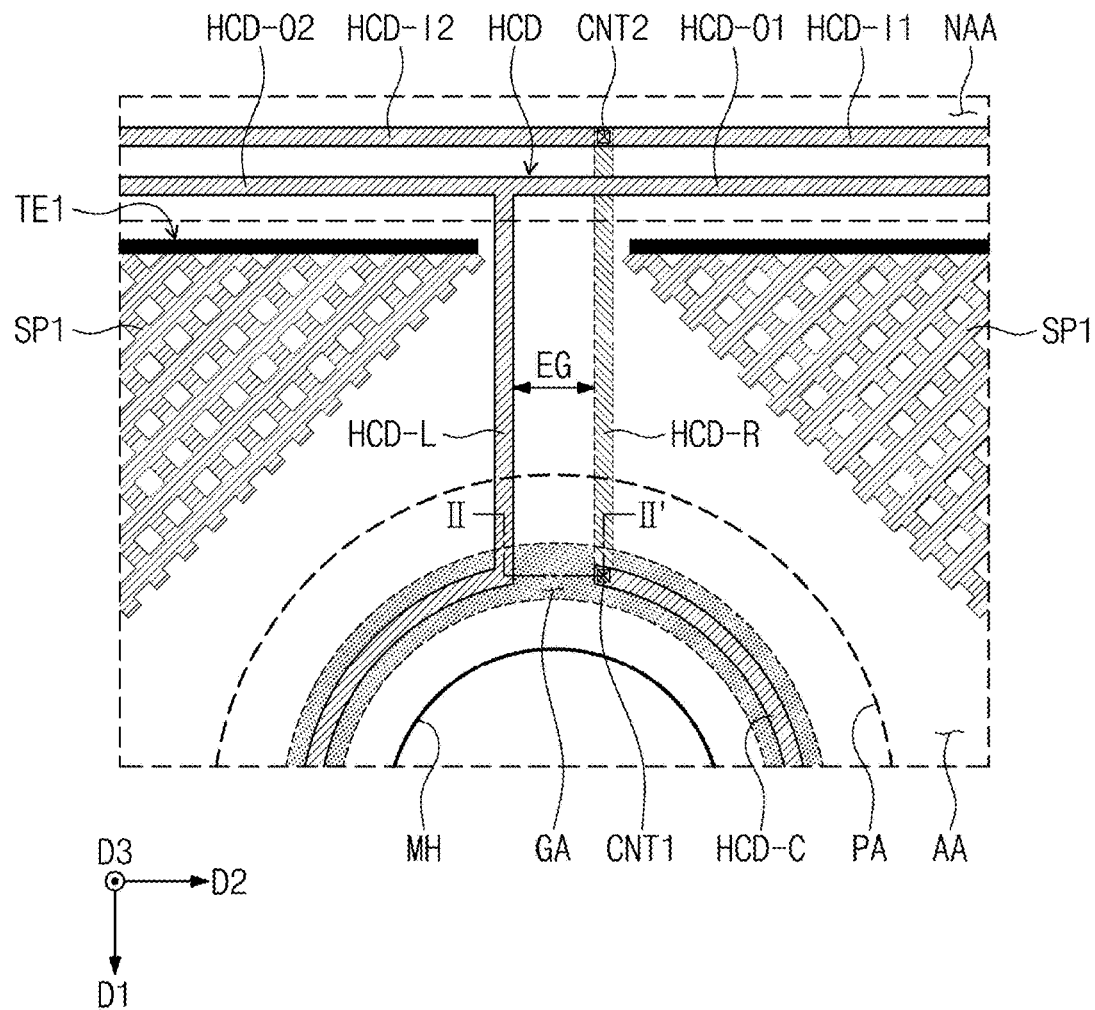
FIG. 5A is an enlarged view of a portion of an electronic device according to an embodiment of the inventive concept.
Figure 5B:
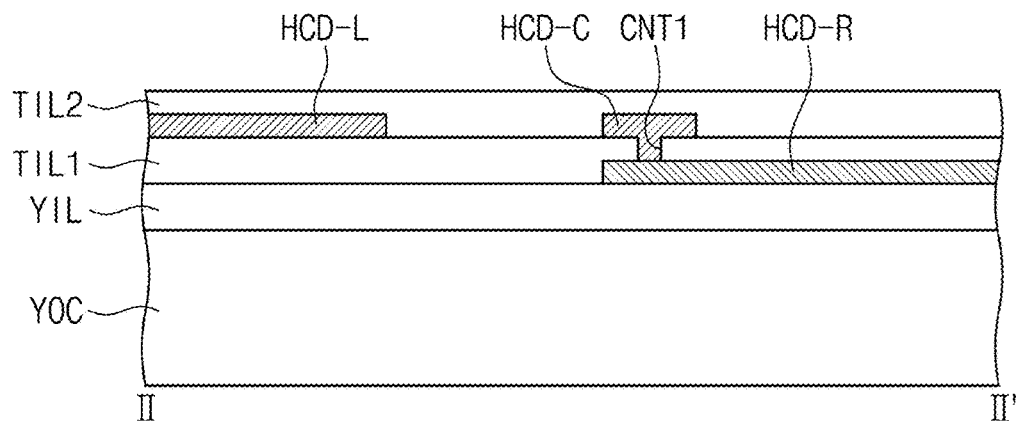
FIG. 5B is a cross-sectional view taken along line II-II' shown in FIG. 5A.

FIG. 1 is an assembled perspective view of an electronic device according to an embodiment of the inventive concept. FIG. 2A is an exploded perspective view of an electronic device according to an embodiment of the inventive concept. FIG. 2B is a block diagram of the electronic device shown in FIG. 2A. FIG. 3 is a plan view schematically showing an area XX' shown in FIG. 2A. FIG. 4A is a plan view of an input detection member according to an embodiment of the inventive concept. FIG. 4B is a cross-sectional view of an electronic device taken along line I-I' of FIG. 4A. FIG. 5A is an enlarged view of a portion of an electronic device according to an embodiment of the inventive concept. FIG. 5B is a cross-sectional view taken along line II-II' shown in FIG. 5A. Hereinafter, an electronic device according to the inventive concept will be described with reference to FIGS. 1 to 5B.

Referring to FIGS. 1 and 2A, an electronic device EA displays an image IM toward a third direction D3 on a plane defined by a first direction D1 and a second direction D2. The electronic device EA includes a window layer WM, a display module DM, an electronic module ID, and a cover case EDC. The display module DM according to the inventive concept includes a display member DU and an input detection member TU. The display module DM according to one embodiment includes at least one module hole MH defined through a front surface IS of the display module DM and a rear surface that is opposite the front surface IS. In FIG. 2A, one module hole MH is shown as an example. In other embodiments, the display module DM may include two or more module holes MH corresponding to a respective electronic module ID.

The window layer WM is disposed on the display module DM to cover the front surface IS of the display module DM. The window layer WM includes a front surface FS that is exposed to the outside. The image IM displayed on the display member DU of the display module DM is viewed from the outside through the front surface FS of the window layer WM.

The window layer WM may have a single layer or a multi-layer structure. For example, the window member WM may have a laminated structure of a plurality of plastic films bonded with an adhesive, or may have a laminated structure of a glass substrate and a plastic film bonded with an adhesive. The window layer WM may be optically transparent. For example, the window layer WM may include glass or plastic.

The front surface FS of the window layer WM may be divided into a transmissive area TA and a bezel area BZA. The transmissive area TA may correspond to an area transmitting light provided from the display module DM. The transmissive area TA may have a shape corresponding to an active area AA of the display module DM. For example, the transmissive area TA overlaps the front surface IS or at least a part of the active area AA. Accordingly, the image IM displayed in the active area AA of the display module DM may be visually recognized through the transmissive area TA.

The bezel area BZA may correspond to an area with a lower light transmittance compared to the transmissive area TA. The bezel area BZA may define the shape of the transmissive area TA. The bezel area BZA is adjacent to the transmissive area TA, and the bezel area BZA according to an embodiment may have a closed line shape surrounding the transmissive area TA. However, the inventive concept is not limited to this embodiment, and the bezel area BZA may be disposed on only one or more selective sides of the transmissive area TA or one or more portions thereof. In some embodiments, the bezel area BZA may be omitted. It is understood that the inventive concept of the present disclosure is not limited to any particular embodiment.

The bezel area BZA may have a predetermined color. The bezel area BZA covers a peripheral area NAA of the display module DM to prevent the peripheral area NAA from being visually recognized from the outside. For example, if light generated by the display member DU of the display module DM leaks into the peripheral area NAA, the light leaked onto the bezel area BZA may be blocked so that the leaked light into the peripheral area NAA may be prevented from being viewed from the outside.

The display member DU of the display module DM displays the image IM on the front surface IS of the display module DM. The front surface IS may be divided into the active area AA, a hole area PA, and the peripheral area NAA. The image IM is displayed in the active area AA. The peripheral area NAA is adjacent to the active area AA. The active area AA may correspond to an area in which a pixel PX of the display member DU to be described later is disposed.

The hole area PA according to an embodiment overlaps the module hole MH. The hole area PA may correspond to an area that is at least partially surrounded by the active area AA. Although FIG. 2A shows a shape in which the hole area PA is entirely surrounded by the active area AA, one area of the hole area PA may be surrounded by the active area AA and the remaining area of the hole area PA may be surrounded by the peripheral area NAA. It is understood that the inventive concept of the present disclosure is not limited to any particular embodiment. In the present example, the hole area PA overlaps the module hole MH.

Referring to FIG. 2B, a power supply module PM supplies power necessary for the overall operation of the electronic device EA. The power supply module PM may include a battery module.

The electronic module ID includes various functional modules for operating the electronic device EA. The electronic module ID may include a first electronic module EM1 and a second electronic module EM2.

The first electronic module EM1 may be directly mounted on a motherboard (not shown) that is electrically connected to the display module DM or may be mounted on a separate board and electrically connected to the motherboard through a connector (not shown) or the like.

The first electronic module EM1 may include a control module CM, a wireless communication module TM, an image input module IIM, an audio input module AIM, a memory MM, and an external interface OIP. Some of the modules may not be mounted on the motherboard, but may be electrically connected to the motherboard through a flexible circuit board or a connector.

The control module CM controls the overall operation of the electronic device EA. The control module CM may be a microprocessor. For example, the control module CM activates or deactivates the display module DM. The control module CM may control other modules such as the image input module IIM and the audio input module AIM based on a touch signal received through the electronic device EA.

The wireless communication module TM may transmit/receive a wireless signal to/from another device via a Bluetooth or a Wi-Fi connection. For example, the wireless communication module TM may transmit/receive a voice signal. The wireless communication module TM includes a transmitter TM1 for modulating and transmitting a signal to be transmitted, and a receiver TM2 for modulating a received signal.

The image input module IIM processes an image signal and converts it into image data that may be displayed on the display module DM.

The audio input module AIM receives an external sound signal, for example, by a microphone in a recording mode, a voice recognition mode, etc., and converts it into electrical voice data.

The memory MM may store the data received at the image wireless communication module TM, the image input module IIM, and the audio input module AIM, and the used data may be deleted from the memory MM. In addition, it is possible to store and/or delete data in and from the memory MM necessary for controlling the second electronic module EM2.

The external interface OIP serves as an interface to one or more external devices such as charger, a wired/wireless data port, a card socket (e.g., a memory card, a SIM/UIM card).

The second electronic module EM2 may include an audio output module AOM, a light emitting module LM, a light receiving module LRM, and a camera module CMM. The modules included in the second electronic module EM2 may be directly mounted on a motherboard, or mounted on a separate substrate and electrically connected to the display module DM through a connector, and/or electrically connected to the first electronic module EM1.

The audio output module AOM converts sound data received from the wireless communication module TM or the sound data stored in the memory MM and outputs the sound data, for example, using a speaker.

The light emitting module LM generates and outputs light. The light emitting module LM may output infrared rays. The light emitting module LM may include an LED element. The light receiving module LRM may detect infrared rays. The light receiving module LRM may be activated when an infrared ray of a predetermined level or higher is detected. The light receiving module LRM may include a Complementary metal-oxide-semiconductor (CMOS) sensor. After the infrared ray generated by the light emitting module LM is outputted, the infrared light is reflected by an external object (e.g., a user's finger or a face), and the reflected infrared ray may be incident onto the light receiving module LRM. The camera module CMM captures an image of a subject.

The electronic module ID shown in FIG. 2A may be, in particular, any one or more of the modules included in the second electronic module EM2. In this case, the first electronic module EM1 and the remaining modules of the second electronic module EM2 may be disposed at different positions and are not shown. For example, the electronic module ID may include at least one of the audio output module AOM, the light emitting module LM, the light receiving module LRM, and the camera module CMM.

The electronic module ID according to one embodiment may be inserted in the module hole MH. In addition, the electronic module ID may be disposed on the rear surface of the display member DU adjacent to the module hole MH. In one embodiment, only one of the modules included in the electronic module ID may be exposed to the outside through the module hole MH. For example, only lenses included in the camera module CMM may be exposed through the module hole MH. Alternatively, the electronic module ID may be disposed on the rear surface of the display member DU and spaced apart from the display member DU on a cross-sectional view.

The display member DU according to the embodiment of the inventive concept includes the module hole MH formed in the active area AA so that a separate space for the electronic module ID in the peripheral area NAA may not be necessary. Accordingly, the area of the bezel area BZA is reduced, so that the electronic device EA having a narrow bezel may be realized. Further, when the electronic module ID is accommodated in the module hole MH, the electronic device EA may be realized to have a thin form factor.

The relationship between the pixel PX and the module hole MH included in the display member DU of the display module DM is exemplarily shown in FIG. 3.

The pixel PX according to one embodiment is disposed in the active area AA of the display module DM. The pixels PX may be spaced apart from the hole area PA and surround the hole area PA. Although not shown in the drawings, the pixels PX spaced apart with the hole area PA therebetween may be connected through a signal line passing through the hole area PA to receive the same signal.

Referring again to FIG. 2A, the cover case EDC may be coupled with the window layer WM. The cover case EDC provides the rear surface of the electronic device EA. The cover case EDC is coupled with the window layer WM to provide an internal space. The display module DM, the electronic module ID, and various modules/components shown in FIG. 2B may be accommodated in an internal space defined by the cover case EDC and the window layer WM. The cover case EDC may include a material having a relatively high stiffness. For example, the cover case EDC may include a plurality of frames and/or plates made of glass, plastic, or metal. The cover case EDC may stably protect the structures of the electronic device EA that are accommodated in the inner space from external impacts.

Referring to FIGS. 2A and 4A, the input detection member TU according to the inventive concept may be disposed on the display member DU. The input detection member TU may include a first detection electrode TE1, a second detection electrode TE2, a first detection trace wiring SL1, and a second detection trace wiring SL2 arranged on a plane. The input detection member TU includes a detection area for detecting an external input and a non-detection area adjacent to the detection area. The detection area according to one embodiment may overlap the active area AA, and the non-detection area may overlap the peripheral area NAA.

The first detection electrode TE1 extends along the first direction D1. The plurality of first detection electrodes TE1 may be arranged along the second direction D2. The first detection electrode TE1 includes a plurality of first detection sensors SP1 arranged along the first direction D1 and first connection patterns BP1 disposed between the first detection sensors SP1 to connect adjacent first detection sensors SP1.

The second detection electrode TE2 may be arranged to be insulated from the first detection electrode TE1. The second detection electrode TE2 extends along the second direction D2. The plurality of second detection electrodes TE2 may be arranged along the first direction D1. The second detection electrode TE2 includes a plurality of second detection sensors SP2 arranged along the second direction D2 and second connection patterns BP2 disposed between the second detection sensors SP2 to connect adjacent second detection sensors SP2. Each of the first detection electrode TE1 and the second detection electrode TE2 may have a mesh shape.

The input detection member TU detects a change in mutual capacitance between the first detection electrode TE1 and the second detection electrode TE2 to detect an external input, or detects a change in self-capacitance of each of the first detection electrode TE1 and the second detection electrode TE2 to detect an external input. The input detection member TU according to an embodiment of the inventive concept may detect an external input in various ways, and is not limited to any particular embodiment.

The external input may include various types of inputs provided to the electronic device EA. The externally applied input may be provided in various forms. For example, the external input may include a non-contact external input (e.g., hovering) that is applied close to or spaced a predetermined distance from the electronic device EA as well as a contact input by a portion of a human body, such as a user's hand. Further, the external input may have various forms such as force, pressure, and light, and is not limited to any particular form of input.

The first detection trace wiring SL1 is connected to respective one of the first detection electrodes TE1. The second detection trace wiring SL2 is connected to respective one of the second detection electrodes TE2. The first detection trace wiring SL1 and the second detection trace wiring SL2 may extend to the peripheral area NAA. For example, the first detection trace wiring SL1 and the second detection trace wiring SL2 may be disposed in the non-detection area that overlaps the peripheral area NAA and may not be visible from the outside.

For convenience of description, FIG. 4A shows only a subset of the first detection trace wirings SL1 and the second detection trace wirings SL2 connected to one of the first detection electrodes TEL and the second detection electrodes TE2, respectively, among the plurality of detection trace wirings. For example, two first detection trace wirings SL1 that are connected to both ends of a first detection electrode TE1 disposed at the leftmost are illustratively shown in FIG. 4A.

Meanwhile, one first detection electrode TE1 according to one embodiment may be connected to two first detection trace wirings SL1. The two first detection trace wirings SL1 connected to one end and the other end of one first detection electrode TE1 may be respectively connected to respective ones of detection pads PD1 separately and independently from each other. Accordingly, even if the first detection electrode TEL has a relatively long length along the first direction D1 as compared to the second detection electrode TE2, an electrical signal may be uniformly applied to the entire region. Thus, the input detection member TU may provide a uniform external input detection environment on the entire detection area, regardless of the shapes and configurations of the first detection electrodes TE1.

Similarly, the second detection electrode TE2 may also be connected to two second detection trace wirings SL2. In another embodiment, each of the first detection electrode TE1 and the second detection electrode TE2 may be connected to only one signal detection trace wiring SL1 or SL2.

The input detection member TU according to an embodiment of the inventive concept may be driven in various ways, and is not limited to any particular embodiment.

Although not shown in the drawings, the detection pad PD1 of the input detection member TU may be connected to a touch flexible circuit board (not shown) disposed on one side of the peripheral area NAA. The touch flexible circuit board may be connected to a main circuit board (not shown). The main circuit board may receive a signal from the input detection member TU.

The electronic device EA according to the inventive concept includes at least crack detection wiring HCD. The crack detection wiring HCD may be disposed on the same layer as the input detection member TU. The crack detection wiring HCD is disposed adjacent to the module hole MH. In addition, the crack detection wiring HCD is spaced apart from the detection electrodes TE1 and TE2 of the input detection member TU. In FIG. 4A, the input detection member TU and the crack detection wiring HCD are shown together for convenience of explanation.

A portion of the crack detection wiring HCD may extend to the peripheral area NAA and be connected to one of detection pads PD2. The detection pads PD2 include a first input pad PD-I1, a second input pad PD-I2, a first output pad PD-O1, and a second output pad PD-O2. The detection pads PD2 may be connected to a touch flexible circuit board (not shown) to receive signals from the main circuit board (not shown), or to output signals to the main circuit board.

The crack detection wiring HCD includes a first input trace wiring HCD-I1, a second input trace wiring HCD-I2, a first output trace wiring HCD-O1, and a second output trace wiring HCD-O2. One end of the crack detection wiring HCD has an open-curved shape surrounding the module hole MH, and it is connected to one of the first and second input trace wirings HCD-I1 and HCD-I2. One ends and the other ends of the input trace wirings HCD-I1 and HCD-I2 extended to the peripheral area NAA are respectively connected to the first input pad PD-I1 and the second input pad PD-I2.

The other end of the crack detection wiring HCD also has an open-curved shape that is connected to the first and second output trace wirings HCD-O1 and HCD-O2. One ends and the other ends of the output trace wirings HCD-O1 and HCD-O2 extended to the peripheral area NAA are respectively connected to the first output pad PD-O1 and the second output pad PD-O2.

The crack detection wiring HCD according to an embodiment may determine whether or not at least one of the layers disposed under the crack detection wiring HCD is cracked in a process of forming the module hole MH. For example, the module hole MH is formed after the crack detection wiring HCD is formed, and a signal is applied to the detection pads PD2 that is connected to the crack detection wiring HCD to determine whether or not at least one of the layers forming the display module DM is cracked.

In FIG. 4A, the input trace wirings HCD-I1 and HCD-I2 correspond to different portions of a single wiring but are referred to as the first input trace wiring HCD-I1 and the second input trace wiring HCD-I2 for the convenience of explanation, Similarly, the output trace wirings HCD-O1 and HCD-O2 correspond to different portions of a single wiring but are referred to as the first output trace wiring HCD-O1 and the second output trace wiring HCD-O2.

When a signal is applied to the first input pad PD-I1, the signal passes through the crack detection wiring HCD surrounding the module hole MH through the first input trace wiring HCD-I1 that is connected to the first input pad PD-I1. The signal may be delivered to the first output pad PD-O1 through the first output trace wiring HCD-O1.

When a crack did not occur in any one of the layers disposed under the crack detection wiring HCD, the signal is delivered to the first output pad PD-O1. If a crack occurs in any one of the layers disposed under the crack detection wiring HCD, for example, in at least one of the right side of the input detection member TU and the hole area PA where the first input trace wiring HCD-I1 and the first output trace wiring HCD-O1 are arranged, the signal may not be delivered to the first output pad PD-O1.

Further, when a signal is applied to the second input pad PD-I2, the signal passes through the crack detection wiring HCD surrounding the module hole MH through the second input trace wiring HCD-I2 that is connected to the second input pad PD-I2. The signal may be delivered to the second output pad PD-O2 through the second output trace wiring HCD-O2.

When a crack did not occur in any one of the layers disposed under the crack detection wiring HCD, the signal is delivered to the second output pad PD-O2. If a crack occurs in any one of the layers disposed under the crack detection wiring HCD, for example, in at least one of the left side of the input detection member TU and the hole area PA where the second input trace wiring HCD-I2 and the second output trace wiring HCD-O2 are arranged, the signal may not be delivered to the second output pad PD-O2.

According to the inventive concept, a crack detection wiring HCD that is disposed on the same layer as the input detection member TU can determine whether or not any one of the layers included in the display module DM is cracked in the process of forming the module hole MH that is defined through the display module DM. Thus, the electronic device EA with improved reliability may be provided.

Referring to FIG. 4B, the display member DU according to an embodiment includes a base substrate BS, a pixel PX, a sealing part TFE, a dam part DMP, a first groove BR1, a second groove BR2, and a plurality of insulating layers.

The base substrate BS may include a glass substrate, a metal substrate, and a flexible plastic substrate. However, the inventive concept is not limited thereto, and the base substrate BS may be a substrate including a base layer containing an organic material.

For example, organic materials of the base substrate BS may include at least one of polyimide, polyethylene naphthalate, polyethylene terephthalate, polyarylate, polycarbonate, polyetherimide, and polyethersulfone. Therefore, the base substrate BS according to the inventive concept may be rigid or flexible, and is not limited to any particular embodiment.

A barrier layer BI is disposed on the base substrate BS. The barrier layer BI may cover the base substrate BS. The barrier layer BI may be an insulating layer including an inorganic material. For example, the barrier layer BI may include at least one of aluminum oxide (AlOx), titanium oxide (TiOx), silicon oxide (SiOx), silicon oxynitride (SiOxNy), zirconium oxide (ZrOx), and hafnium oxide (HfOx). The barrier layer BI may be formed of multiple layers of inorganic films. The barrier layer BI may prevent foreign matter from entering from the outside.

Although not shown in the drawings, the display member DU according to one embodiment may further include a buffer layer (not shown). The buffer layer may be disposed on the barrier layer BI. The buffer layer may include an inorganic or organic material. The buffer layer may have a higher adhesive force than the barrier layer BI with respect to a semiconductor pattern SL of a transistor TR or a first insulating layer IL1 to be described later. Thus, the transistor TR may be stably formed on the base substrate BS.

The pixel PX according to one embodiment includes the transistor TR and an organic light emitting element ED connected to the transistor TR.

The transistor TR includes the semiconductor pattern SL, a control electrode CE, an input electrode IE, and an output electrode OE. The transistor TR controls charge transfer in the semiconductor pattern SL through the control electrode CE to output an electrical signal inputted from the input electrode IE through the output electrode OE.

The semiconductor pattern SL is disposed on the base substrate BS. The semiconductor pattern SL may include at least one of a crystalline semiconductor material, a metal oxide semiconductor material, polycrystalline silicon, and amorphous silicon. Although the transistor TR according to one embodiment shows the control electrode CE disposed on the semiconductor pattern SL, the inventive concept is not limited thereto. The control electrode CE may be disposed on the base substrate BS and may be covered by the first insulating layer IL1, and may have a bottom-gate structure in which the semiconductor pattern SL is disposed on the first insulating layer IL1, but the inventive concept of the present disclosure is not limited to any particular embodiment.

The first insulating layer IL1 may be disposed between the semiconductor pattern SL and the control electrode CE. The first insulating layer IL1 covers the base substrate BS and the semiconductor pattern SL. The first insulating layer IL1 includes an inorganic material, and is not limited to any particular embodiment.

The control electrode CE is disposed on the semiconductor pattern SL. The control electrode CE is spaced apart from the semiconductor pattern SL with the first insulating layer IL1 interposed therebetween. The control electrode CE may at least partially overlap the semiconductor pattern SL.

A second insulating layer IL2 may be disposed between the control electrode CE and the input electrode IE and between the control electrode CE and the output electrode OE. The second insulating layer IL2 covers the first insulating layer IL1 and the control electrode CE. The second insulating layer IL2 includes an inorganic material, and is not limited to any particular embodiment.

The input electrode IE and the output electrode OE are disposed on the second insulating layer IL2. The input electrode IE and the output electrode OE are respectively connected to the semiconductor pattern SL through the first insulating layer IL1 and the second insulating layer IL2. However, this is only an example, and the input electrode IE and the output electrode OE may be directly connected to the semiconductor pattern SL in other embodiments.

A third insulating layer IH is disposed on the second insulating layer IL2. The third insulating layer IH may cover the transistor TR.

The organic light emitting element ED includes a first electrode E1, a second electrode E2, a light emitting layer EL, and a charge control layer OL. The first electrode E1 is disposed on the third insulating layer IH. The first electrode E1 may be electrically connected to the transistor TR through the third insulating layer IH. The first electrode E1 may be provided in plurality. At least a portion of each of the plurality of first electrodes E1 may be exposed by an opening OP of a corresponding pixel defining layer PLE.

The second electrode E2 is disposed on the first electrode E1. The second electrode E2 may be disposed to cover only a portion of the pixel defining layer PLE. However, the inventive concept is not limited thereto, and the second electrode E2 may extend to the hole area PA to cover the hole area PA.

For example, the second electrodes E2 of each of the plurality of organic light emitting elements ED may be provided in an integral shape connected to each other. Thus, each of the plurality of organic light emitting elements ED may be supplied with the same voltage through the common second electrode E2. Therefore, a separate patterning process may be omitted to form the second electrode E2. On the other hand, this is only an example, and the second electrode E2 may be provided in plurality to correspond to each or a group of the openings OP in other embodiments.

The second electrode E2 may include an optically transparent transmissive electrode. For example, the second electrode E2 may include at least one of indium zinc oxide (IZO), indium tin oxide (ITO), indium gallium oxide (IGO), indium gallium zinc oxide (IGZO), and any mixtures/compounds thereof. Accordingly, the display module DM displays the image IM on the front surface IS. However, this is only an example, and the second electrode E2 may include a reflective electrode or a transflective electrode depending on a direction in which the image IM is displayed, and is not limited to any particular embodiment.

The light emitting layer EL is disposed between the first electrode E1 and the second electrode E2. The light emitting layer EL may be provided in a plurality and disposed in the respective opening OP. The organic light emitting element ED may generate light by activating the light emitting layer EL according to a potential difference between the first electrode E1 and the second electrode E2. The area where light is generated by the light emitting layer EL may be defined as a light emitting area PXA.

The charge control layer OL is disposed between the first electrode E1 and the second electrode E2. The charge control layer OL is disposed adjacent to the light emitting layer EL. In the present embodiment, the charge control layer OL is shown as being disposed between the light emitting layer EL and the second electrode E2. However, this is only an example. The charge control layer OL may be disposed between the light emitting layer EL and the first electrode E1, and may be provided in a plurality of layers stacked along the third direction D3 with the light emitting layer EL interposed therebetween.

The charge control layer OL may have an integral shape overlapping a front surface of the base substrate BS without a separate patterning process.

The charge control layer OL may be disposed in an area other than the openings OP that are formed in the pixel defining layer PLE. The charge control layer OL may improve the luminous efficiency by controlling the movement of electrons. The charge control layer OL may include an electron transport layer and an electron injection layer.

Although not shown in the drawings, the pixel PX of the display member DU may be connected to a signal line (not shown) connected to a corresponding signal pad (not shown). The signal pad may be connected to a flexible circuit board (not shown) that is disposed on one side of the peripheral area NAA. The flexible circuit board may include driving elements, for example, a data driving circuit including a driving chip for driving the pixel PX. The flexible circuit board may be connected to a main circuit board (not shown). The main circuit board may include a timing controller. The timing controller receives image signals and converts the image signals into image data corresponding to the operation of the pixels PX. Additionally, the timing controller may receive various control signals such as a vertical synchronization signal, a horizontal synchronization signal, a main clock signal, and a data enable signal, and may output control signals.

The sealing part TFE is disposed on the organic light emitting element ED. In the present embodiment, the sealing part TFE may include a first sealing inorganic film LIL, a sealing organic film OEL, and a second sealing inorganic film UIL.

The first sealing inorganic film LIL may be disposed on the second electrode E2 and a portion of the charge control layer OL that is exposed by the second electrode E2. The second sealing inorganic film UIL is disposed on the first sealing inorganic film LIL. The first sealing inorganic film LIL and the second sealing inorganic film UIL may be sealed with the sealing organic film OEL. Each of the first sealing inorganic film LIL and the second sealing inorganic film UIL may include an inorganic material. Examples of the inorganic material may include at least one of aluminum oxide (AlOx), silicon oxide (SiOx), silicon nitride (SiNx), silicon oxynitride (SiOxNy), silicon carbide (SiCx), titanium oxide (TiOx), zirconium oxide (ZrOx), and zinc oxide (ZnOx).

The sealing organic film OEL may be disposed between the first sealing inorganic film LIL and the second sealing inorganic film UIL. The sealing organic film OEL may include an organic material. Examples of the organic material may include at least one of an epoxy, a polyimide, a polyethylene terephthalate, a polycarbonate, a polyethylene, and a polyacrylate.

The first sealing inorganic film LIL and the second sealing inorganic film UIL may have an integral shape disposed on the front surface of the display member DU on a plane. Each of the first sealing inorganic film LIL and the second sealing inorganic film UIL may partially overlap the sealing organic film OEL. Accordingly, the first sealing inorganic film LIL and the second sealing inorganic film UIL may be spaced from each other in the third direction D3 with the sealing organic film OEL interposed therebetween in some areas, and in other areas, may be in direct contact in the third direction D3. The sealing part TFE seals the organic light emitting element ED to protect the organic light emitting element ED from foreign substances that may be introduced from the outside.

The display member DU according to one embodiment may further include the dam part DMP. The dam part DMP may overlap the hole area PA. The dam part DMP may extend along the edges adjacent to the hole area PA at the boundary between the active area AA and the hole area PA. The dam part DMP may be surrounded by the active area AA or disposed on at least one side of the active area AA, for example, a side adjacent to a pad (not shown) or a driving circuit (not shown).

The dam part DMP includes a first dam part DMP1 and a second dam part DMP2. The dam part DMP may be disposed on the second insulating layer IL2. The first dam part DMP1 may include the same material as the third insulating layer IH. The second dam part DMP2 may include the same material as the pixel defining layer PLE. The dam part DMP shown in FIG. 4B is formed of a plurality of layers including the first dam part DMP1 and the second dam part DMP2, but the inventive concept of the present disclosure is not limited thereto. In some embodiment, the dam part DMP may have a single layer structure including the same material as at least one of the third insulating layer IH and the pixel defining layer PLE.

The dam part DMP may define an area where the liquid organic material spreads in the process of forming the sealing organic film OEL. The sealing organic film OEL may be formed by an ink jet method in which a liquid organic material is applied onto the first sealing inorganic film LIL. In this case, the dam part DMP sets the boundary of the area where the liquid organic material is applied and prevents the liquid organic material from overflowing outside the dam part DMP.

The display module DM according to one embodiment includes a flat part YP. The flat part YP includes a flat organic film YOC and a flat inorganic film YIL.

The flat part YP is disposed between the display member DU and the input detection member TU. The flat organic film YOC covers a portion of the display member DU. For example, the flat organic film YOC may be disposed on the display member DU that overlaps the hole area PA in the display member DU. The flat organic film YOC is disposed between the display member DU overlapping the hole area PA and the input detection member TU to compensate for a step between the display member DU and the input detection member TU.

According to one embodiment, a step CD may be formed at the boundary between the active area AA and the hole area PA. The step CD may be formed due to one or more process errors in a process of applying the flat organic film YOC on the display member DU. The step CD may be formed by the end of the flat organic film YOC adjacent to the sealing part TFE.

The flat inorganic film YIL may cover the flat organic film YOC. The flat inorganic film YIL may have an integral shape that overlaps the front surface of the display member DU.

The input detection member TU includes a first conductive pattern TML1, a second conductive pattern TML2, a first detection insulating layer TIL1, and a second detection insulating layer TIL2. The input detection member TU according to one embodiment is disposed on the flat inorganic film YIL. For example, the first conductive pattern TML1 among the first and second conductive patterns TML1 and TML2 may be disposed directly on the flat inorganic film YIL.

The first detection insulating layer TILL is disposed on the flat inorganic film YIL to cover the first conductive pattern TML1.

The second conductive pattern TML2 among the conductive patterns TML1 and TML2 may be disposed directly on the first detection insulating layer TIL1. The second conductive pattern TML2 may be disposed on a different layer from the first conductive pattern TML1 through the first detection insulating layer TIL2. A portion of the second conductive pattern TML2 may be connected to the first conductive pattern TML1 through the first detection insulating layer TIL1.

The second detection insulating layer TIL2 is disposed on the first detection insulating layer TIL1 to cover the second conductive pattern TML2.

According to one embodiment, the first conductive pattern TML1 may be formed of the first connection pattern BP1 shown in FIG. 4A. The second conductive pattern TML2 may be formed of the first detection sensors SP1, the second detection sensors SP2, and the second connection pattern BP2 shown in FIG. 4A.

However, the inventive concept of the present disclosure is not limited thereto, depending on the arrangement relationship of the first and second detection electrodes TE1 and TE2 included in the input detection member TU, based on the first detection insulating layer TIL1, the pattern disposed under the first detection insulating layer TIL1 may be formed of the first conductive pattern TML1, and the pattern disposed on the first detection insulating layer TIL1 may be formed of the second conductive pattern TML2.

Each of the first conductive pattern TML1 and the second conductive pattern TML2 may not overlap the light emitting area PXA of the pixel PX. Thus, the light provided by the display member DU may be viewed by the user without interference from the input detection member TU.

The display member DU according to one embodiment may include the first groove BR1 and the second groove BR2. The first and second grooves BR1 and BR2 overlap the hole area PA. Portions of the insulating layers including the barrier layer BI, the first insulating layer IL1, and the second insulating layer IL2 and the base substrate BS are depressed from the upper surface of the charge control layer OL, and the exposed and recessed surfaces are covered by at least one of the first sealing inorganic film LIL and the second sealing inorganic film UIL, thereby forming the first and second grooves BR1 and BR2.

For example, the first groove BR1 may be disposed apart from the module hole MH with the dam part DMP interposed therebetween. The first groove BR1 includes a first inner space BR-I1. Portions of the insulating layers including the barrier layer BI, the first insulating layer IL1, and the second insulating layer IL2 and the base substrate BS are depressed from the upper surface of the charge control layer OL, and the exposed and recessed surfaces are covered by the first sealing inorganic film LIL, thereby forming the first inner space BR-I1. The first inner space BR-I1 of the first groove BR1 may be filled with the sealing organic film OEL of the sealing part TFE.

The second groove BR2 may be disposed between the dam part DMP and the module hole MH. The second groove BR2 includes a second inner space BR-I2. Portions of the insulating layers including the barrier layer BI, the first insulating layer IL1, and the second insulating layer IL2 and the base substrate BS are depressed from the upper surface of the charge control layer OL, and the exposed and recessed surfaces are covered by the first sealing inorganic film LIL and the second sealing inorganic film UIL, thereby forming the second inner space BR-I2. The second inner space BR-I2 of the second groove BR2 may be filled with the flat organic film YOC of the flat part YP.

According to one embodiment, the first and second grooves BR1 and BR2 that are disposed around the module hole MH can block a movement path of moisture and oxygen that may be introduced from the module hole MH. Therefore, the display module DM with improved reliability may be provided. In addition, the first and second grooves BR1 and BR2 having improved durability may be provided by filling the inner spaces BR-I1 and BR-I2 of the first and second grooves BR1 and BR2 with organic films such as the sealing organic film OEL and the flat organic film YOC.

The module hole MH may be defined by an inner surface GE including the ends of penetrated configurations among the configurations of the display module DM. For example, penetrated and exposed ends including an end BS-E of the base substrate BS, an end BI-E of the barrier layer BI, an end IL1-E of the first insulating layer IL1, an end IL2-E of the second insulating layer IL2, an end OL-E of the charge control layer OL, an end LIL-E of the first sealing inorganic film LIL, an end UIL-E of the second sealing inorganic film UIL, an end YOC-E of the flat organic film YOC, an end YIL-E of the flat inorganic film YIL, an end TIL1-E of the first detection insulating layer TIL1, and an end TIL2-E of the second detection insulating layer TIL2 may define the inner surface GE of the module hole MH.

According to the inventive concept of the present disclosure, a portion of the crack detection wiring HCD may be disposed on the same layer as at least one of the first conductive pattern TML1 and the second conductive pattern TML2. FIG. 4B shows an embodiment in which a portion of the crack detection wiring HCD cut along line I-I' is disposed on the same layer as the second conductive pattern TML2.

According to one embodiment, a portion of the crack detection wiring HCD may be spaced further away from the base substrate BS than the second conductive pattern TML2 due to the step CD formed by the flat organic film YOC.

The crack detection wiring HCD may be disposed in an area overlapping at least one of the first and second grooves BR1 and BR2. The crack detection wiring HCD according to an embodiment may be disposed in an area where the thickness of the flat organic film YOC is the largest in the third direction D3 in the hole area PA. For example, the crack detection wiring HCD may overlap the groove area GA that corresponds to the area where the second groove BR2 is disposed.

Referring to FIGS. 5A and 5B, the crack detection wiring HCD includes the first input trace wiring HCD-I1, the second input trace wiring HCD-I2, the first output trace wiring HCD-O1, the second output trace wiring HCD-O2, a hole wiring HCD-C, a first detection wiring HCD-R, and a second detection wiring HCD-L.

The hole wiring HCD-C overlaps the hole area PA. For example, the hole wiring HCD-C may overlap the groove area GA where the second groove BR2 of the hole area PA is disposed. The hole wiring HCD-C may have an open-curved shape surrounding at least a portion of the module hole MH on a plane. The hole wiring HCD-C may be spaced from the detection electrodes TEL and TE2 of the input detection member TU. Accordingly, the hole wiring HCD-C may be disposed spaced from the conductive patterns TML1 and TML2.

One end of the hole wiring HCD-C according to one embodiment is connected to the first detection wiring HCD-R, and the other end spaced apart from the one end of the hole wiring HCD-C is connected to the second detection wiring HCD-L.

The first detection wiring HCD-R and the second detection wiring HCD-L are spaced apart from each other with a separation space EG on a plane. Each of the first detection wiring HCD-R and the second detection wiring HCD-L extends from the hole area PA to the peripheral area NAA through the active area AA.

For example, one end of the first detection wiring HCD-R is connected to one end of the hole wiring HCD-C disposed in the hole area PA, and the other end of the first detection wiring HCD-R is connected to the first and second input trace wirings HCD-I1 and HCD-I2 that are disposed in the peripheral area NAA through the active area AA.

One end of the second detection wiring HCD-L is connected to the other end of the hole wiring HCD-C disposed in the hole area PA, and the other end of the second detection wiring HCD-L is connected to the first and second output trace wirings HCD-O1 and HCD-O2 that are disposed in the peripheral area NAA through the active area AA.

A portion of each of the first detection wiring HCD-R and the second detection wiring HCD-L may overlap a boundary between the active area AA and the hole area PA.

The first detection wiring HCD-R according to one embodiment may be disposed on a different layer from the second detection wiring HCD-L and the hole wiring HCD-C. The first detection wiring HCD-R may be disposed apart from the second detection wiring HCD-L and the hole wiring HCD-C with the first detection insulating layer TIL1 interposed therebetween. The first detection wiring HCD-R and the hole wiring HCD-C may be connected via a first contact hole CNT1 that penetrates through the first detection insulating layer TIL1.

The first detection wiring HCD-R may be disposed on a different layer from the first and second input trace wirings HCD-I1 and HCD-I2 through the first detection insulating layer TIL1. The first detection wiring HCD-R and the input trace wirings HCD-I1 and HCD-I2 may be connected via a second contact hole CNT2 that penetrates through the first detection insulating layer TIL1.

The second detection wiring HCD-L according to one embodiment may be disposed on the same layer as the hole wiring HCD-C. The second detection wiring HCD-L and the hole wiring HCD-C may be disposed on the first detection insulating layer TIL1. Therefore, the second detection wiring HCD-L and the hole wiring HCD-C may be directly connected.

The second detection wiring HCD-L may be disposed on the same layer as the first and second output trace wirings HCD-O1 and HCD-O2. Therefore, the second detection wiring HCD-L and the first and second output trace wirings HCD-O1 and HCD-O2 may be directly connected to each other.

If the first detection wiring HCD-R and the second detection wiring HCD-L are disposed on the same layer, reliability may be deteriorated in discrimination of cracks due to mutual electrical interference. For example, when both of the first detection wiring HCD-R and the second detection wiring HCD-L are disposed on the first detection insulating layer TIL1, the first detection wiring HCD-R and the second detection wiring HCD-L are connected to each other so that a signal to be transmitted to the hole wiring HCD-C may be directly transmitted from the first detection wiring HCD-R through the second detection wiring HCD-L without passing through the hole wiring HCD-C. As a result, the reliability of the display module DM may be deteriorated in determining an occurrence of a crack in a layer of the display module DM.

The first detection wiring HCD-R and the second detection wiring HCD-L may be formed through a photolithography process using a conductive material. If the first detection wiring HCD-R and the second detection wiring HCD-L are formed on the same layer, due to the step CD at the boundary between the active area AA and the hole area PA, a residual film is formed in an area where the conductive material is to be completely patterned, so that the first detection wiring HCD-R and the second detection wiring HCD-L may be connected.

According to the inventive concept, the first detection wiring HCD-R and the second detection wiring HCD-L connected to one end of the module hole MH are spaced apart from each other with a separation space EG on a plane, and disposed on different layers with the first detection insulating layer TIL1 interposed therebetween, so that mutual interference between the active area AA and the hole area PA may be minimized. Accordingly, the reliability of the display module DM for determining an occurrence of a crack in a layer of the display module DM may be improved.

Figure 6A:
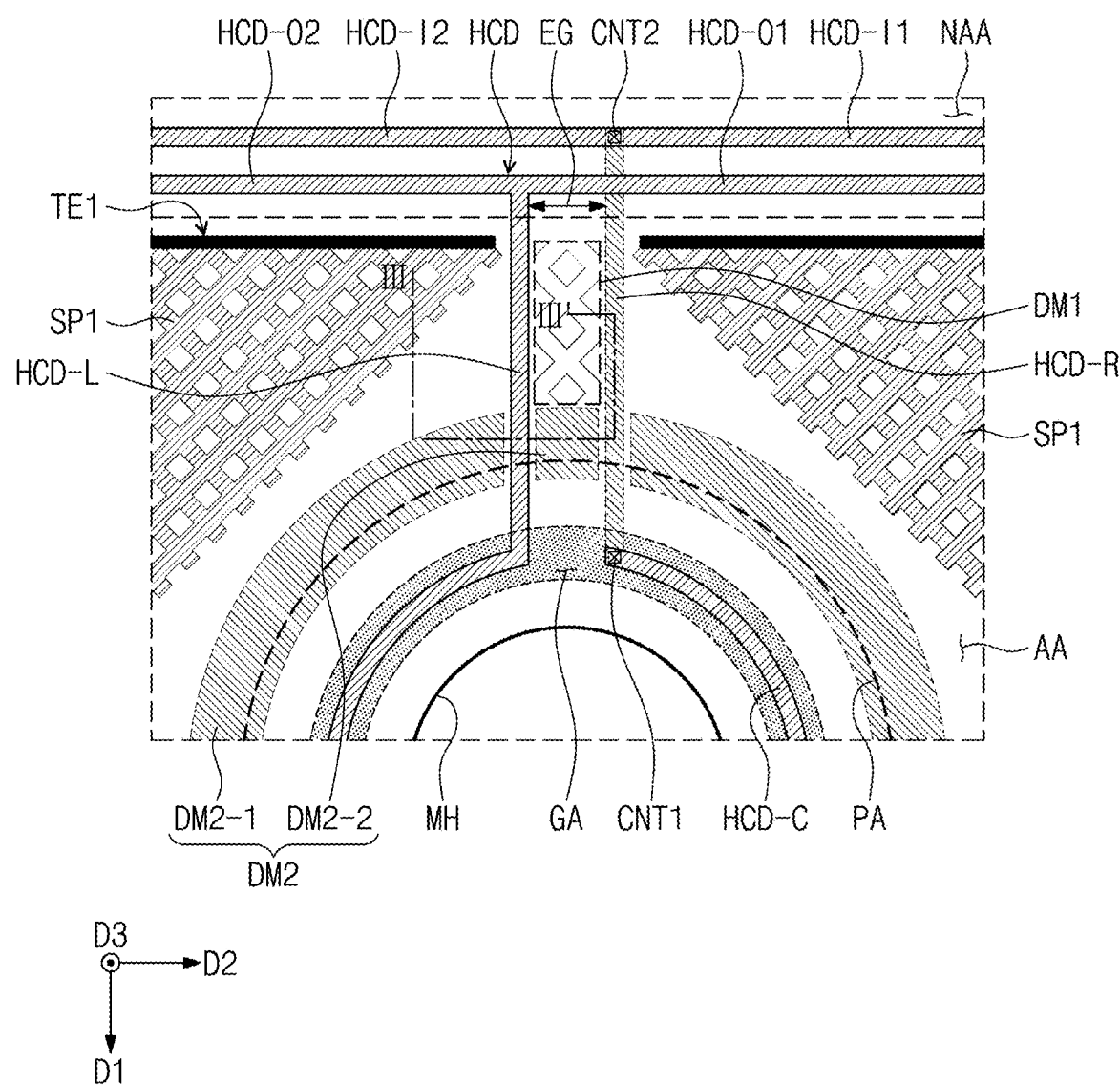
FIG. 6A is an enlarged view of a portion of an electronic device according to an embodiment of the inventive concept.
Figure 6B:
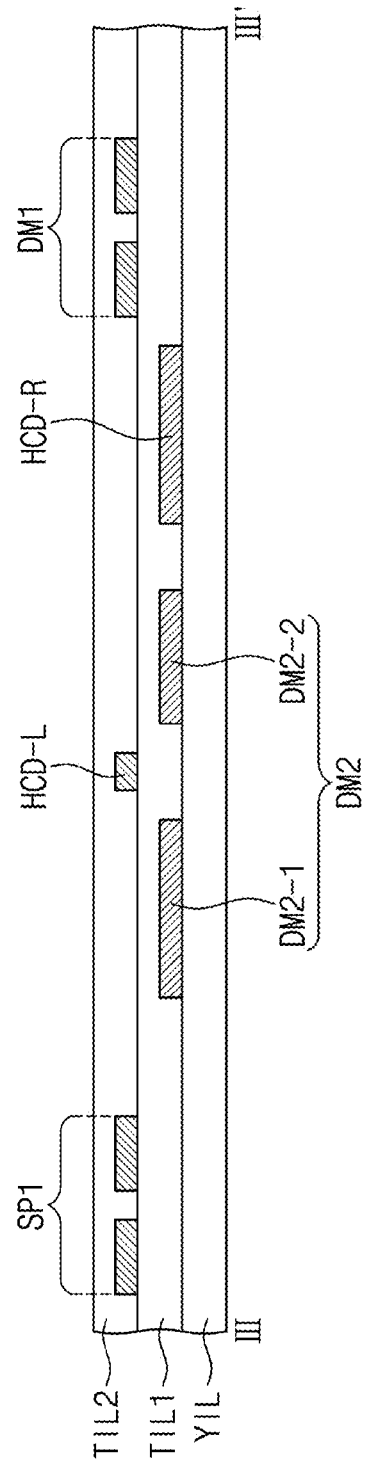
FIG. 6B is a cross-sectional view taken along line III-III' shown in FIG. 6A.

FIG. 6A is an enlarged view of a portion of an electronic device according to an embodiment of the inventive concept. FIG. 6B is a cross-sectional view taken along line III-III' shown in FIG. 6A. The same reference numerals are used for the same components as those described with reference to FIGS. 1 to 5B, and redundant description thereof is omitted.

The display module DM (see FIG. 4B) according to an embodiment may include a first dummy pattern DM1 and a second dummy pattern DM2. The first dummy pattern DM1 and the second dummy pattern DM2 are disposed apart from the crack detection wiring HCD.

The first dummy pattern DM1 may be disposed on a plane in a separation space EG formed between the first detection wiring HCD-R and the second detection wiring HCD-L. The first dummy pattern DM1 is disposed apart from the first detection wiring HCD-R and the second detection wiring HCD-L.

The first dummy pattern DM1 may be disposed on the same layer as the second detection wiring HCD-L and the first detection sensors SP1. The first dummy pattern DM1 may have the same mesh shape as the first detection sensors SP1.

According to the inventive concept, as the first dummy pattern DM1 includes the same layer and the same shape as the first detection sensors SP1 disposed at the uppermost one of the input detection members TU, it is possible to prevent a defect that the space between the first detection sensors SP1 spaced apart from each other is visually recognized.

Although FIG. 6A shows the first dummy pattern DM1 disposed between separation space EG, the inventive concept is not limited thereto, and a dummy pattern may be disposed in other areas on the first detection insulating layer TIL1 as being spaced apart from the first detection sensors SP1 and the second detection sensors SP2 (see FIG. 4A), the second connection pattern BP2, and the hole area PA.

The second dummy pattern DM2 includes a first sub pattern DM2-1 and a second sub pattern DM2-2. The second dummy pattern DM2 is disposed on the same layer as the first detection wiring HCD-R. The first sub pattern DM2-1 may not overlap the first detection wiring HCD-R and the second detection wiring HCD-L and may be disposed surrounding the hole area PA excluding the separation space EG. The second sub pattern DM2-2 may not overlap the first detection wiring HCD-R and the second detection wiring HCD-L and may be disposed in the separation space EG.

The second dummy pattern DM2 is disposed on the flat inorganic film YIL and covered by the first detection insulating layer TIL1. The second dummy pattern DM2 is disposed surrounding the hole area PA, thereby blocking moisture and oxygen flowing into the module hole MH through the module hole MH. Therefore, the display module DM with improved reliability may be provided.

Figure 7:
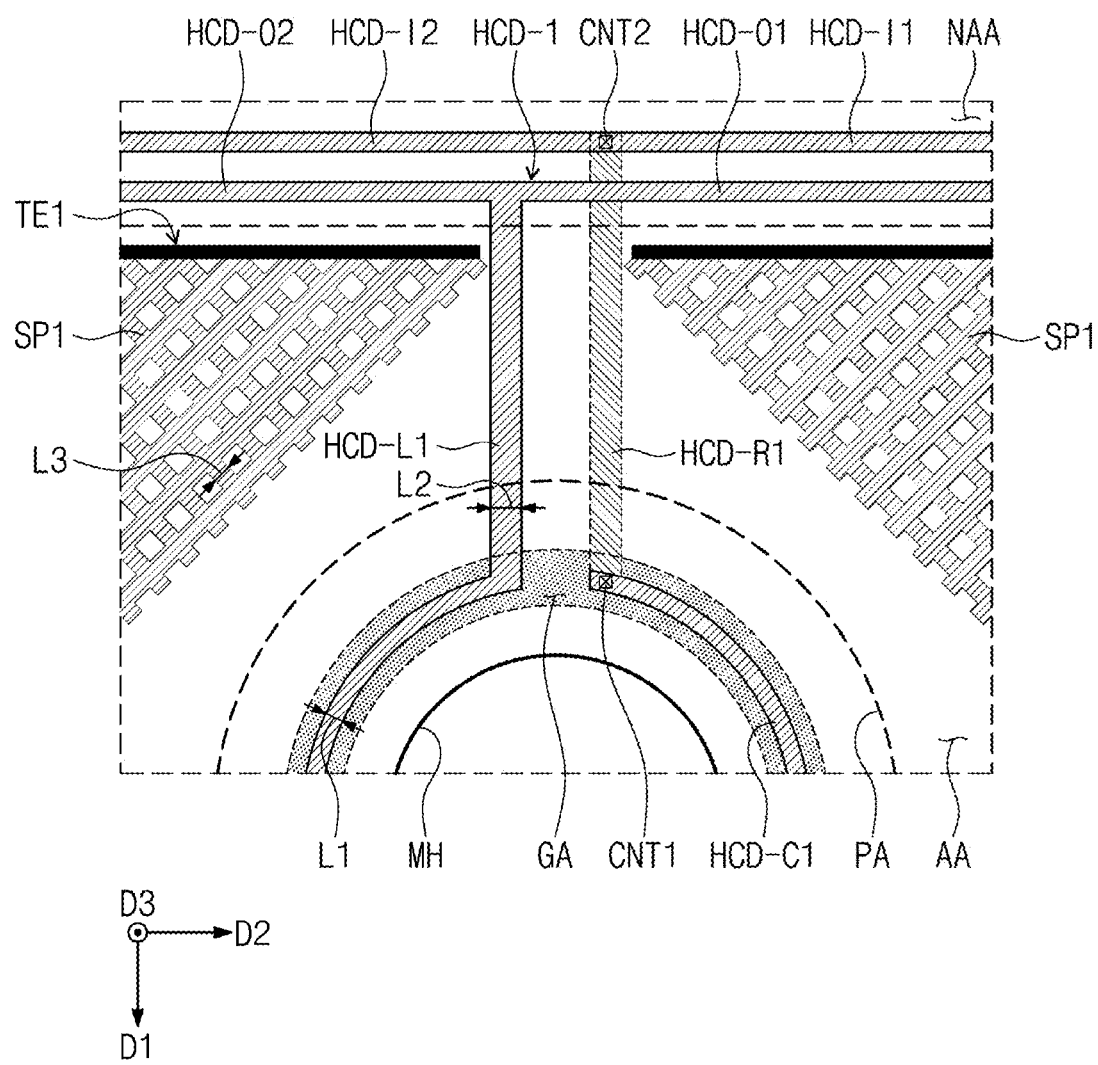
FIG. 7 is an enlarged view of a portion of an electronic device according to an embodiment of the inventive concept.

FIG. 7 is an enlarged view of a portion of an electronic device according to an embodiment of the inventive concept. The same reference numerals are used for the same components as those described with reference to FIGS. 1 to 5B, and redundant description thereof is omitted.

A crack detection wiring HCD-1 according to an embodiment includes a hole wiring HCD-C1, a first detection wiring HCD-R1, a second detection wiring HCD-L1, the first and second input trace wirings HCD-I1 and HCD-I2, and the first and second output trace wiring HCD-O1 and HCD-O2.

The hole wiring HCD-C1 has a first width L1. At least one of the first detection wiring HCD-R1 and the second detection wiring HCD-L1 has a second width L2. According to one embodiment, the second width L2 may be greater than the first width L1.

The first detection sensors SP1 have a third width L3. According to one embodiment, the first width L1 of the hole wiring HCD-C1 may be greater than or equal to the third width L3.

According to one embodiment, as the second width L2 of the first detection wiring HCD-R1 and the second detection wiring HCD-L1 are greater than the first width L1 of the hole wiring HCD-C1 and the third width L3 of the first detection sensors SP1, it is possible to reduce a resistance value of a signal inputted/outputted to/from the hole wiring HCD-C1 from the first detection wiring HCD-R1 and the second detection wiring HCD-L1.

Figure 8A:
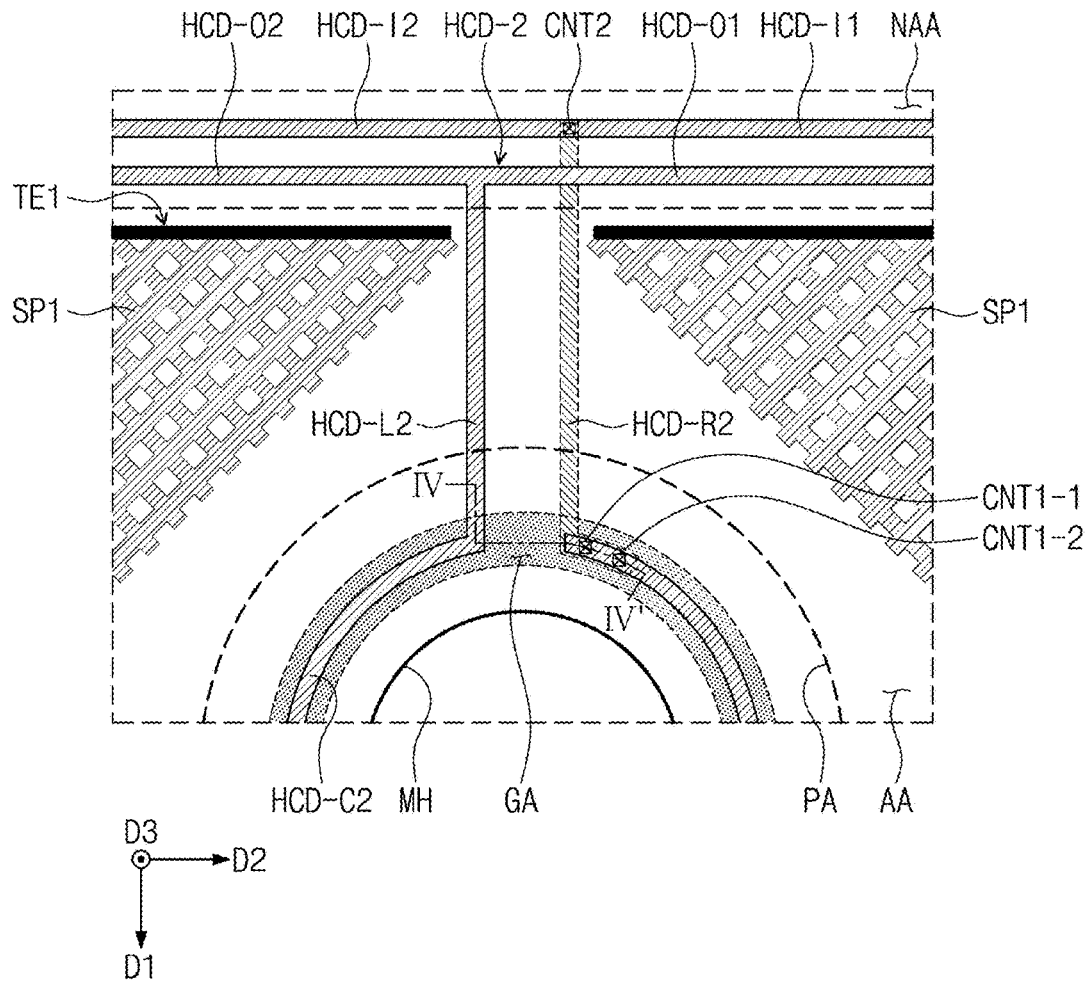
FIG. 8A is an enlarged view of a portion of an electronic device according to an embodiment of the inventive concept.
Figure 8B:
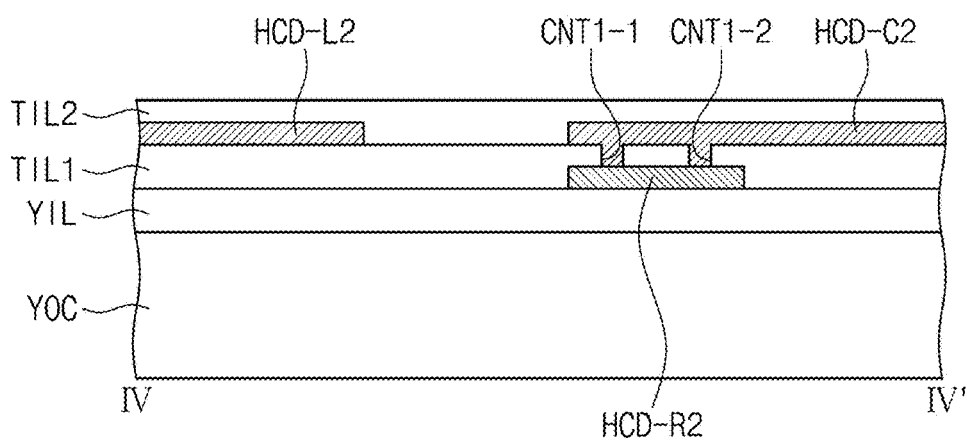
FIG. 8B is a cross-sectional view taken along line IV-IV' shown in FIG. 8A.

FIG. 8A is an enlarged view of a portion of an electronic device according to an embodiment of the inventive concept. FIG. 8B is a cross-sectional view taken along line IV-IV' shown in FIG. 8A. The same reference numerals are used for the same components as those described with reference to FIGS. 1 to 5B, and redundant description thereof is omitted.

A crack detection wiring HCD-2 according to an embodiment includes a hole wiring HCD-C2, a first detection wiring HCD-R2, a second detection wiring HCD-L2, the first and second input trace wirings HCD-I1 and HCD-I2, and the first and second output trace wiring HCD-O1 and HCD-O2.

The second detection wiring HCD-L2 and the hole wiring HCD-C2 are disposed on a different layer from the first detection wiring HCD-R2. second detection wiring HCD-L2 and the hole wiring HCD-C2 may be connected through at least one contact hole.

For example, a portion of the first detection wiring HCD-R2 may extend in a shape corresponding to the hole wiring HCD-C2 and overlap a portion of the hole wiring HCD-C2. The first detection wiring HCD-R2 may be connected to the hole wiring HCD-C2 by a first sub contact hole CNT1-1 and a second sub contact hole CNT1-2 that penetrate through the first detection insulating layer TIL1.

Figure 9A:
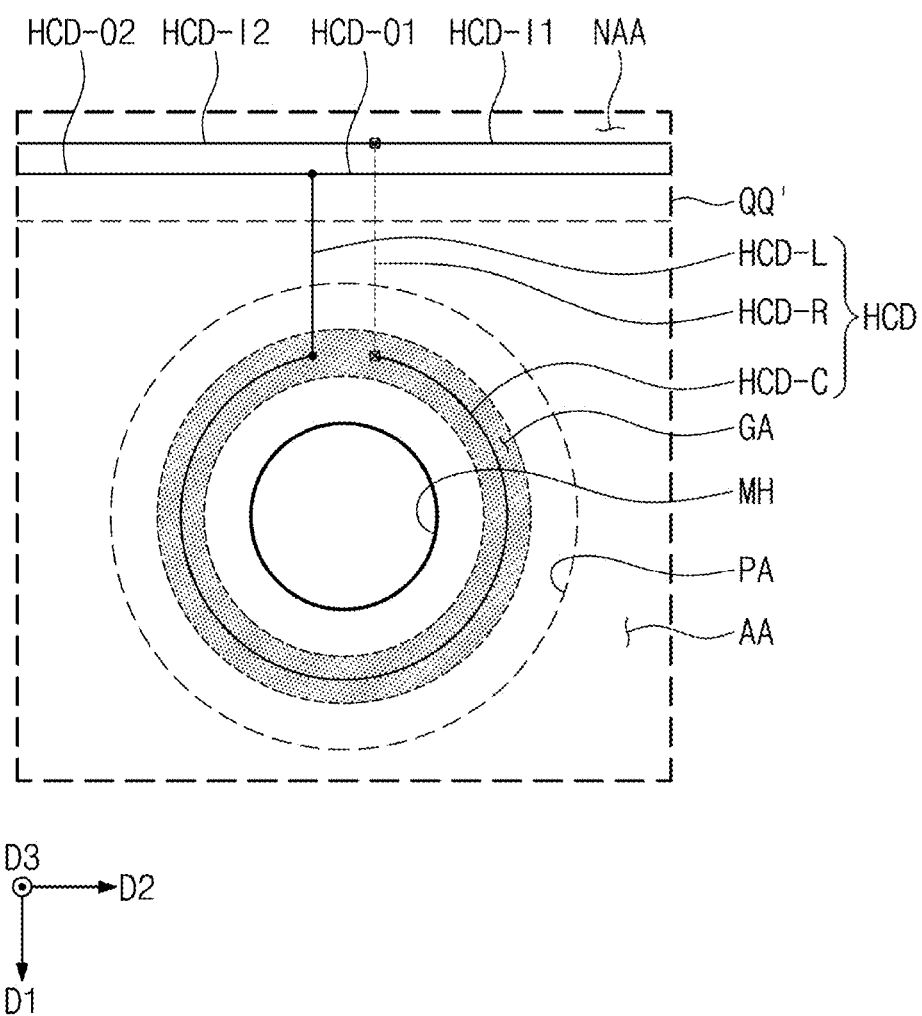
FIG. 9A is an enlarged plan view of area QQ' of FIG. 4A.

FIG. 9A is an enlarged plan view of area QQ' of FIG. 4A. The same reference numerals are used for the same components as those described with reference to FIGS. 1 to 5B, and redundant description thereof is omitted.

The crack detection wiring HCD according to an embodiment includes the hole wiring HCD-C, the first detection wiring HCD-R, the second detection wiring HCD-L, the first and second input trace wirings HCD-I1 and HCD-I2, and the first and second output trace wirings HCD-O1 and HCD-O2.

The hole wiring HCD-C has an open-curved shape surrounding the module hole MH. One end of the hole wiring HCD-C is connected to the first detection wiring HCD-R, and the other end of the hole wiring HCD-C is connected to the second detection wiring HCD-L. The first detection wiring HCD-R and the second detection wiring HCD-L according to the inventive concept are disposed on different layers, and are disposed apart from each other on a plane. Accordingly, the area where the one end and the other end of the hole wiring HCD-C face each other may be an area that does not surround the module hole MH.

According to the inventive concept, as the hole wiring HCD-C has an open-curved shape surrounding the module hole MH, it is possible to easily determine an occurrence of a crack in a layer of the display module DM (see FIG. 4A) that is disposed in the area adjacent to the module hole MH.

Figure 9B:
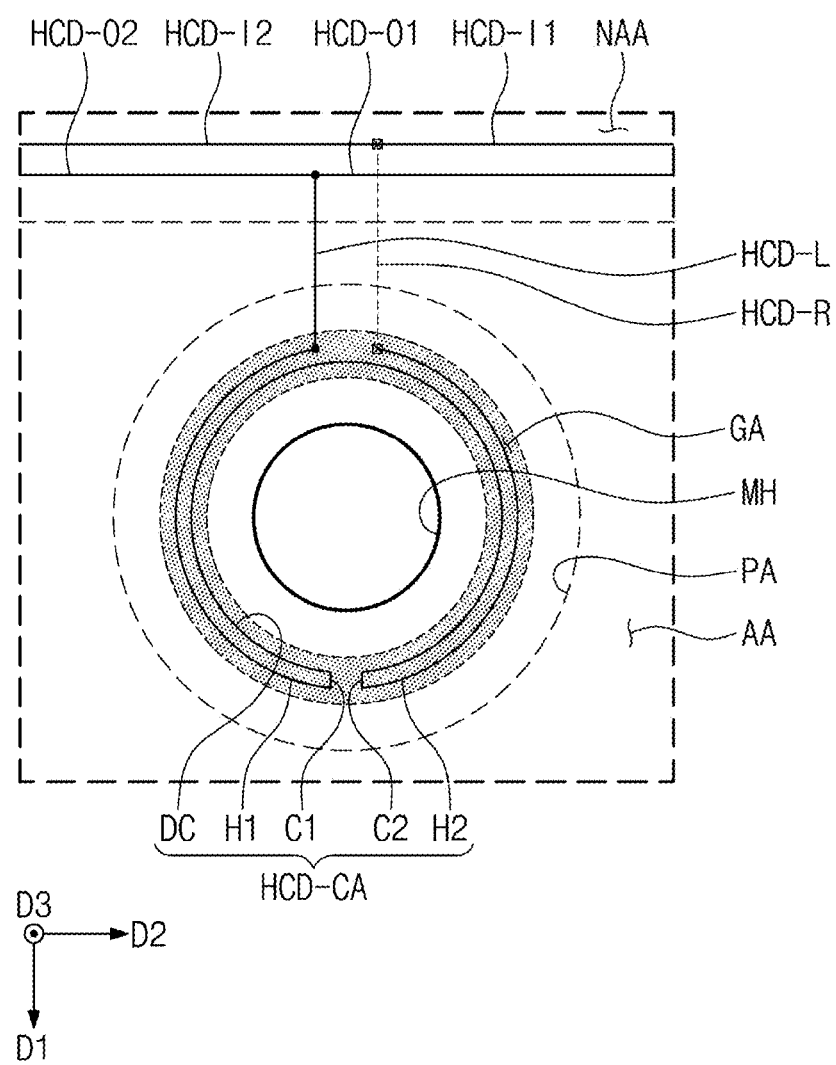
FIG. 9B is a plan view of a crack detection wiring according to an embodiment of the inventive concept.

FIG. 9B is a plan view of a crack detection wiring according to an embodiment of the inventive concept. The same reference numerals are used for the same components as those described with reference to FIGS. 1 to 5B, and redundant description thereof is omitted.

The crack detection wiring HCD according to an embodiment includes a hole wiring HCD-CA, the first detection wiring HCD-R, the second detection wiring HCD-L, the first and second input trace wirings HCD-I1 and HCD-I2, and the first and second output trace wirings HCD-O1 and HCD-O2.

The hole wiring HCD-CA may include a first outer wiring H1, a second outer wiring H2, an inner wiring DC, and connection wirings C1 and C2. The first outer wiring H1, the second outer wiring H2, the inner wiring DC, and the connection wirings C1 and C2 are connected to each other to have an open-curved integral shape.

The first outer wiring H1 and the second outer wiring H2 may be disposed apart from the module hole MH with the inner wiring DC interposed therebetween. The inner wiring DC is disposed between the first outer wiring H1 and the second outer wiring H2 and the module hole MH to be spaced apart from the first outer wiring H1 and the second outer wiring H2.

One end of the first outer wiring H1 is connected to the second detection wiring HCD-L and the other end of the first outer wiring H1 is connected to one end of the inner wiring DC through the first connection wiring C1.

One end of the second outer wiring H2 is connected to the first detection wiring HCD-R, and the other end of the second outer wiring H2 is connected to the other end of the inner wiring DC through the second connection wiring C2.

The hole wiring HCD-CA may have a symmetrical shape with reference to a center line between the first detection wiring HCD-R and the second detection wiring HCD-L. Further, the number of inner wirings DC is not limited to one as long as it has an open-curved integral shape.

According to one embodiment, by enlarging the area of the hole wiring HCD-CA disposed in the hole area PA, it is possible to easily determine an occurrence of a crack in a layer of the display module DM (see FIG. 4A) that is disposed in the area adjacent to the module hole MH.

According to the inventive concept, a crack detection wiring disposed in the area adjacent to the module hole can efficiently determine an occurrence of a crack in a layer of the display module.

In addition, mutual electrical interference between portions of the crack prevention wiring may be reduced by disposing those portions that receive different signals in different layers. Thus, an electronic device EA with improved reliability may be provided.

Although the exemplary embodiments of the inventive concept have been described, it is understood that the inventive concept should not be limited to these exemplary embodiments, and various changes and modifications may be made by one ordinary skilled in the art within the spirit and scope of the inventive concept as hereinafter claimed.

What is claimed is:

1. An electronic device comprising:
    a display module defining a module hole that penetrates from the display module; and
    an electronic module overlapping the module hole,
    wherein the display module comprises:
    a display member comprising a base substrate divided into an active area, a peripheral area adjacent to the active area, and a hole area overlapping the module hole and at least partially surrounded by the active area, and pixels disposed on the base substrate;
    an input detection member disposed on the display member and including detection insulating layers and conductive patterns; and
    a crack detection wiring including a hole wiring insulated from the conductive patterns and overlapping the hole area, a first detection wiring and a second detection wiring connected to one end and the other end of the hole wiring, a trace wiring connected to the first detection wiring and the second detection wiring,
    wherein the first detection wiring is disposed on a same layer as the hole wiring and is directly connected to one end of the hole wiring, and
    the second detection wiring is disposed on a different layer from the first detection wiring and is connected to the other end of the hole wiring through a first contact hole defined in one of the insulating layers of the detection insulating layers.

2. The electronic device of claim 1, wherein the trace wiring is disposed on a same layer as the first detection wiring and is directly connected to the first detection wiring, and
    the second detection wiring is connected to the trace wiring through a second contact hole defined in one of the insulating layers of the detection insulating layers.

3. The electronic device of claim 2, wherein the first contact hole overlaps the hole area, and the second contact hole overlaps the peripheral area.

4. The electronic device of claim 1, wherein the detection insulating layers comprises first to third insulating layers that are sequentially stacked, and
    the first detection wiring and the trace wiring are disposed on the second insulating layer, and the second detection wiring is disposed on the first insulating layer.

5. The electronic device of claim 4, wherein one of the insulating layers of the detection insulating layers corresponds to the second insulating layer.

6. The electronic device of claim 4, further comprising a dummy pattern overlapping a boundary of the active area and the hole area, and spaced apart from the module hole.

7. The electronic device of claim 6, wherein the hole wiring surrounds at least a portion of the module hole, and the dummy pattern surrounds at least a portion of the hole wiring.

8. The electronic device of claim 6, wherein the dummy pattern is disposed on the first insulating layer.

9. The electronic device of claim 6, wherein the dummy pattern comprises a first sub pattern surrounding from one end of the hole wiring to the other end of the hole wiring, and a second sub pattern disposed between the first detection wiring and the second detection wiring, and
    the first sub pattern and the second sub pattern are disconnected.

10. The electronic device of claim 1, wherein the hole wiring comprises:
    a first outer wiring, one end of which is connected to the first detection wiring;
    a second outer wiring spaced apart from the first outer wiring with the module hole interposed therebetween and having one end of which is connected to the second detection wiring; and
    an inner wiring surrounding at least a portion of the module hole and connected to the first outer wiring and second outer wiring.

11. The electronic device of claim 10, wherein the crack detection wiring further comprises:
    a first connection wiring connecting the other end of the first outer wiring and one end of the inner wiring; and
    a second connection wiring connecting the other end of the second outer wiring and the other end of the inner wiring.

12. The electronic device of claim 11, wherein the first outer wiring, the second outer wiring, the inner wiring, the first connection wiring, and the second connection wiring are connected to each other and have an open-curved shape.

13. The electronic device of claim 1, wherein a groove is defined in the base substrate by recessing a portion of the base substrate, and the groove overlaps the hole area and surrounds the module hole.

14. The electronic device of claim 13, wherein the hole wiring overlaps the groove on the plane.

15. The electronic device of claim 1, wherein the first detection wiring and the second detection wiring are disposed spaced apart from each other with a separation space, and wherein the display module further comprises an additional dummy pattern disposed in the separation space.

* * * * *